(12) United States Patent
Tan et al.

(10) Patent No.: US 9,397,139 B1
(45) Date of Patent: Jul. 19, 2016

(54) INTEGRATED INDUCTOR AND MAGNETIC RANDOM ACCESS MEMORY DEVICE

(71) Applicant: GLOBALFOUNDRIES Singapore Pte. Ltd., Singapore (SG)

(72) Inventors: Juan Boon Tan, Singapore (SG); Yi Jiang, Singapore (SG); Wanbing Yi, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/862,174

(22) Filed: Sep. 23, 2015

(51) Int. Cl.
*H01L 27/22* (2006.01)
*H01F 27/28* (2006.01)
*H01L 43/02* (2006.01)
*H01L 43/12* (2006.01)
*H01L 49/02* (2006.01)

(52) U.S. Cl.
CPC .......... *H01L 27/222* (2013.01); *H01F 27/2804* (2013.01); *H01L 28/10* (2013.01); *H01L 43/02* (2013.01); *H01L 43/12* (2013.01)

(58) Field of Classification Search
CPC ................. H01L 27/222–27/224; H01L 28/10
See application file for complete search history.

(56) References Cited

U.S. PATENT DOCUMENTS

| 2002/0145902 | A1* | 10/2002 | Kunikiyo | B82Y 10/00 365/97 |
| 2006/0273418 | A1* | 12/2006 | Chung | G11C 11/16 257/421 |

* cited by examiner

*Primary Examiner* — Daniel Shook
(74) *Attorney, Agent, or Firm* — Horizon IP Pte. Ltd.

(57) ABSTRACT

Devices and methods of forming a device are disclosed. The method includes providing a substrate defined with at least first and second regions. A first upper dielectric layer is provided over the substrate. The first upper dielectric layer comprises a first upper interconnect level with a plurality of metal lines. A dielectric layer is formed over the first upper dielectric layer. The dielectric layer includes a second upper interconnect level with a plurality of metal lines. A magnetic random access memory (MRAM) cell is formed between the first and second upper interconnect levels in the first region. An inductor is formed in the second region. The inductor includes a lower inductor level formed from metal lines in the first upper interconnect level and an upper inductor level formed from metal lines in the second upper interconnect level. The metal lines in the lower inductor level and upper inductor level are coupled by via contacts to form loops of the inductor.

21 Claims, 27 Drawing Sheets

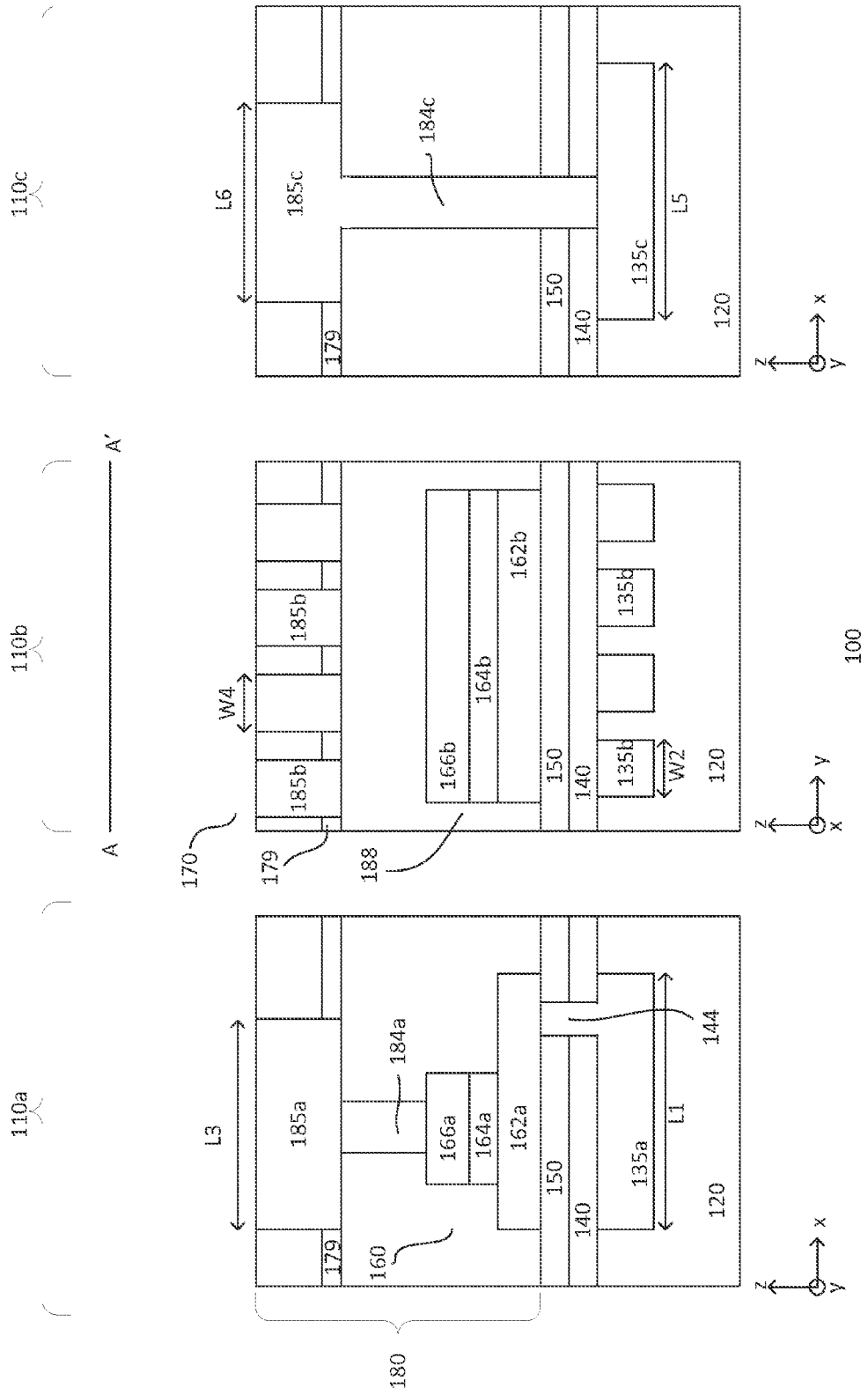

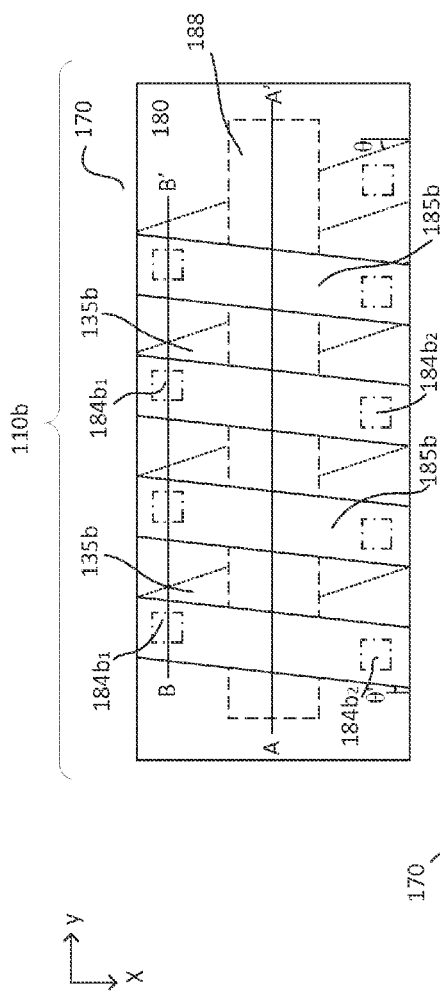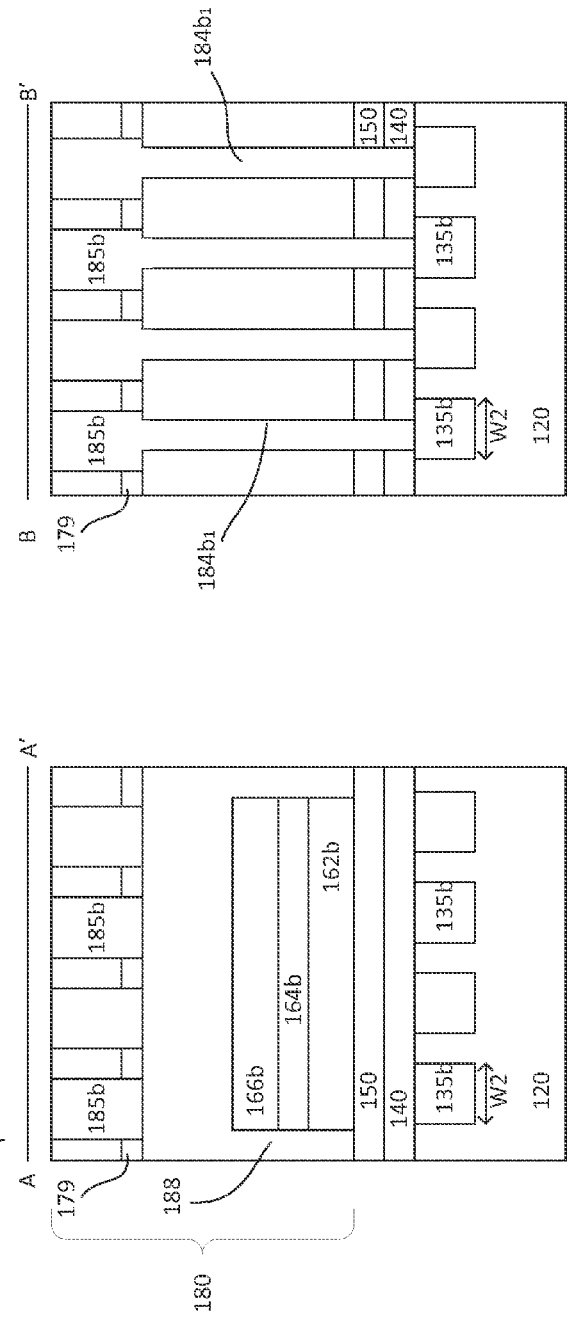
Fig. 1b
Fig. 1c

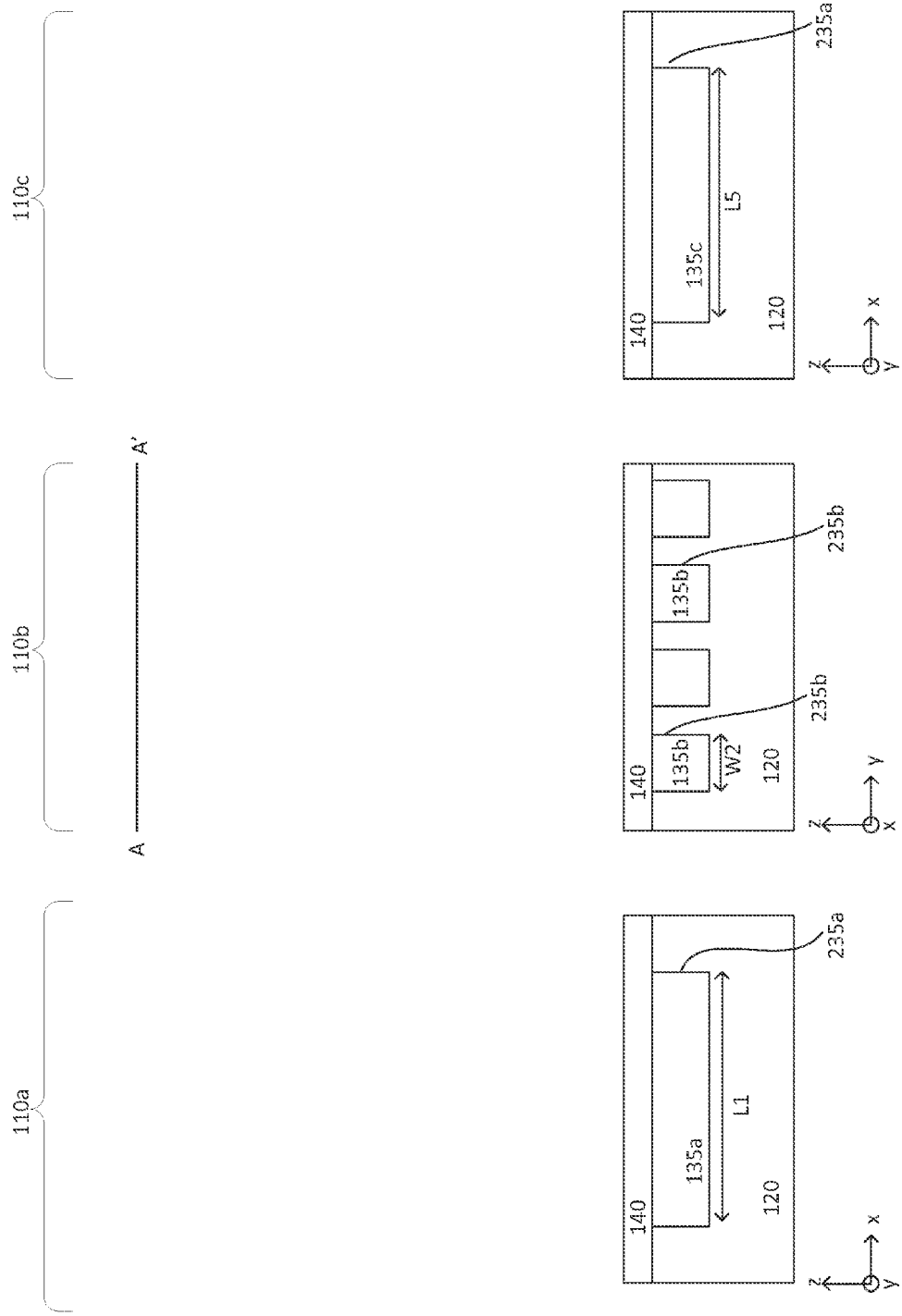

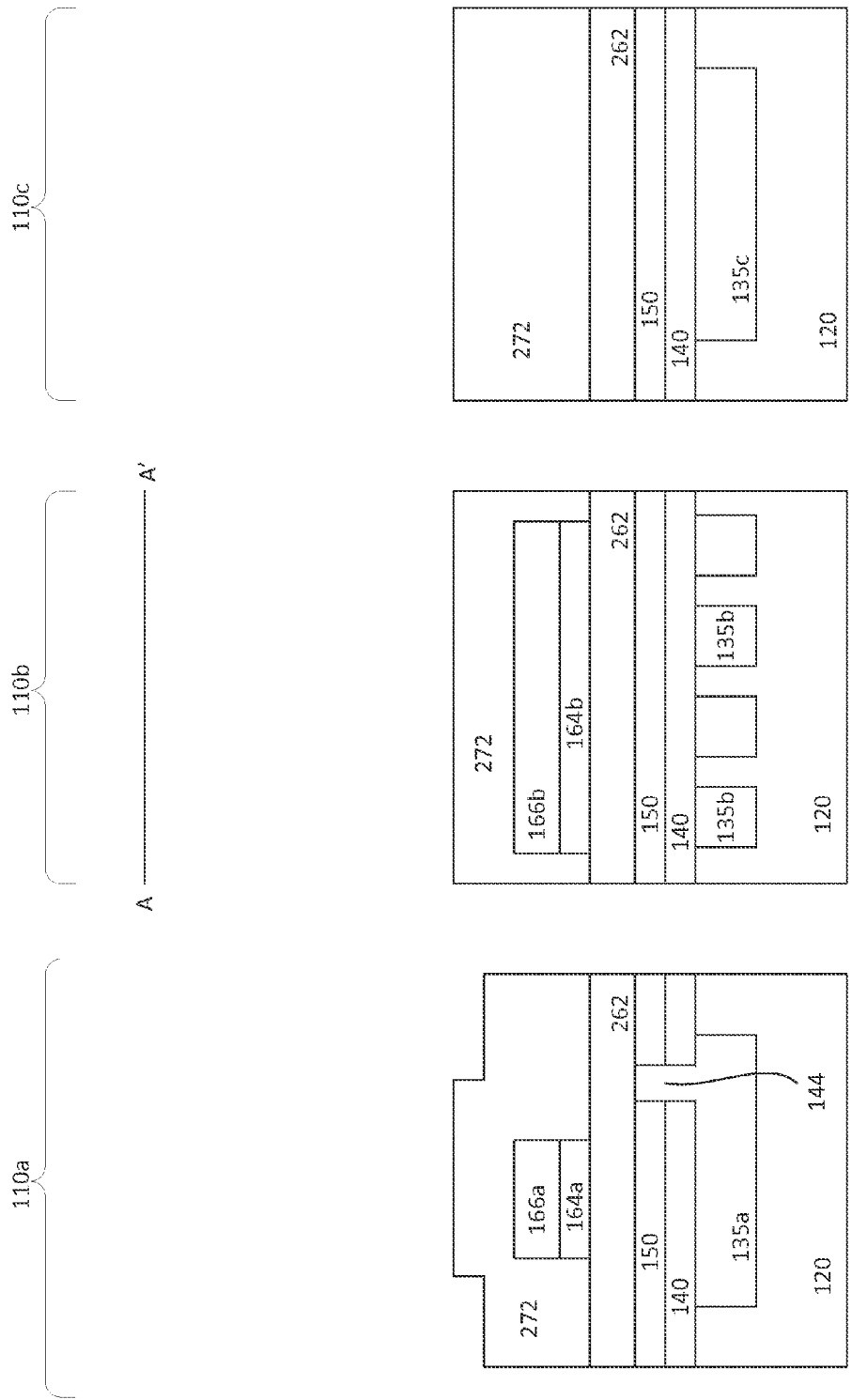

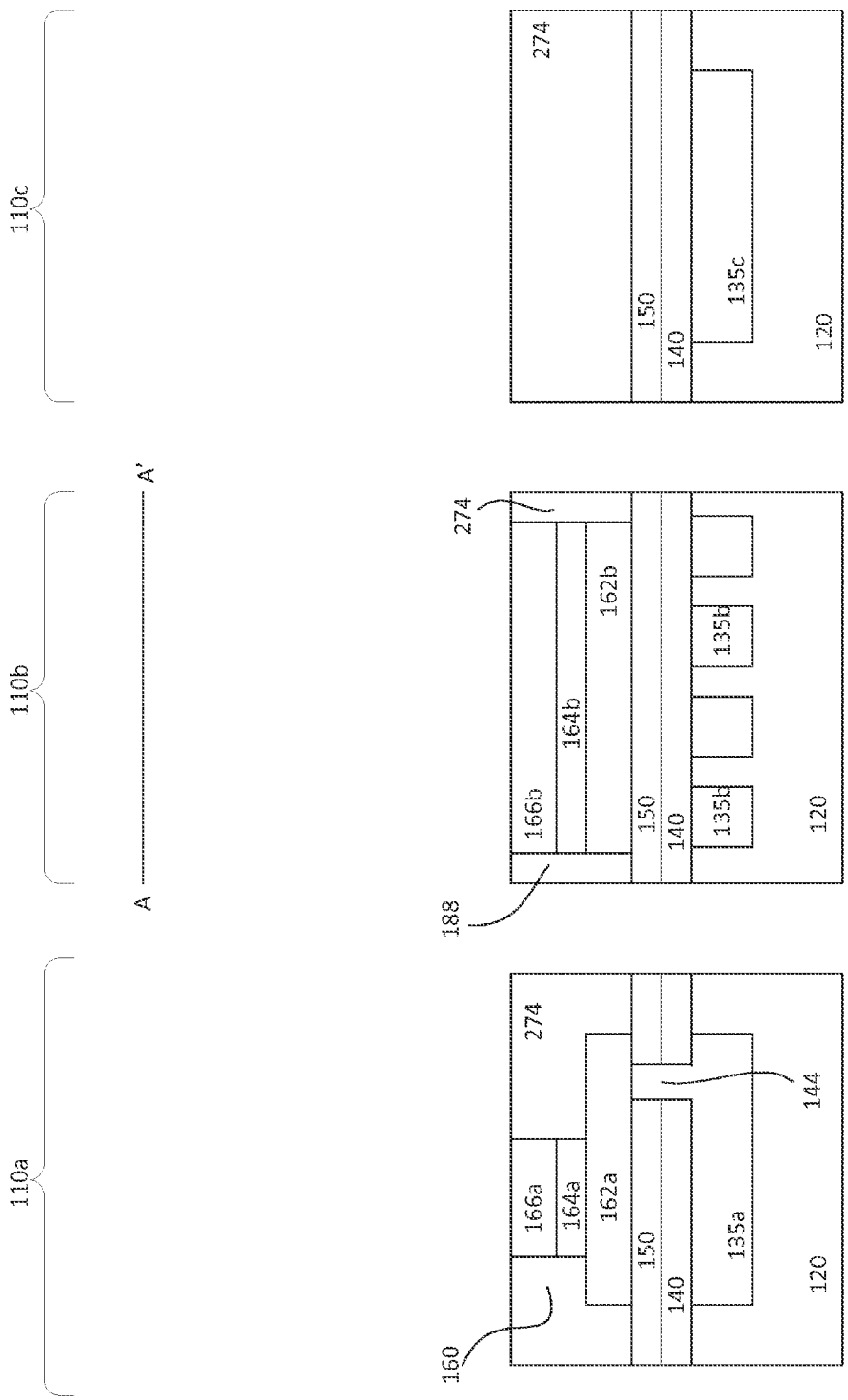

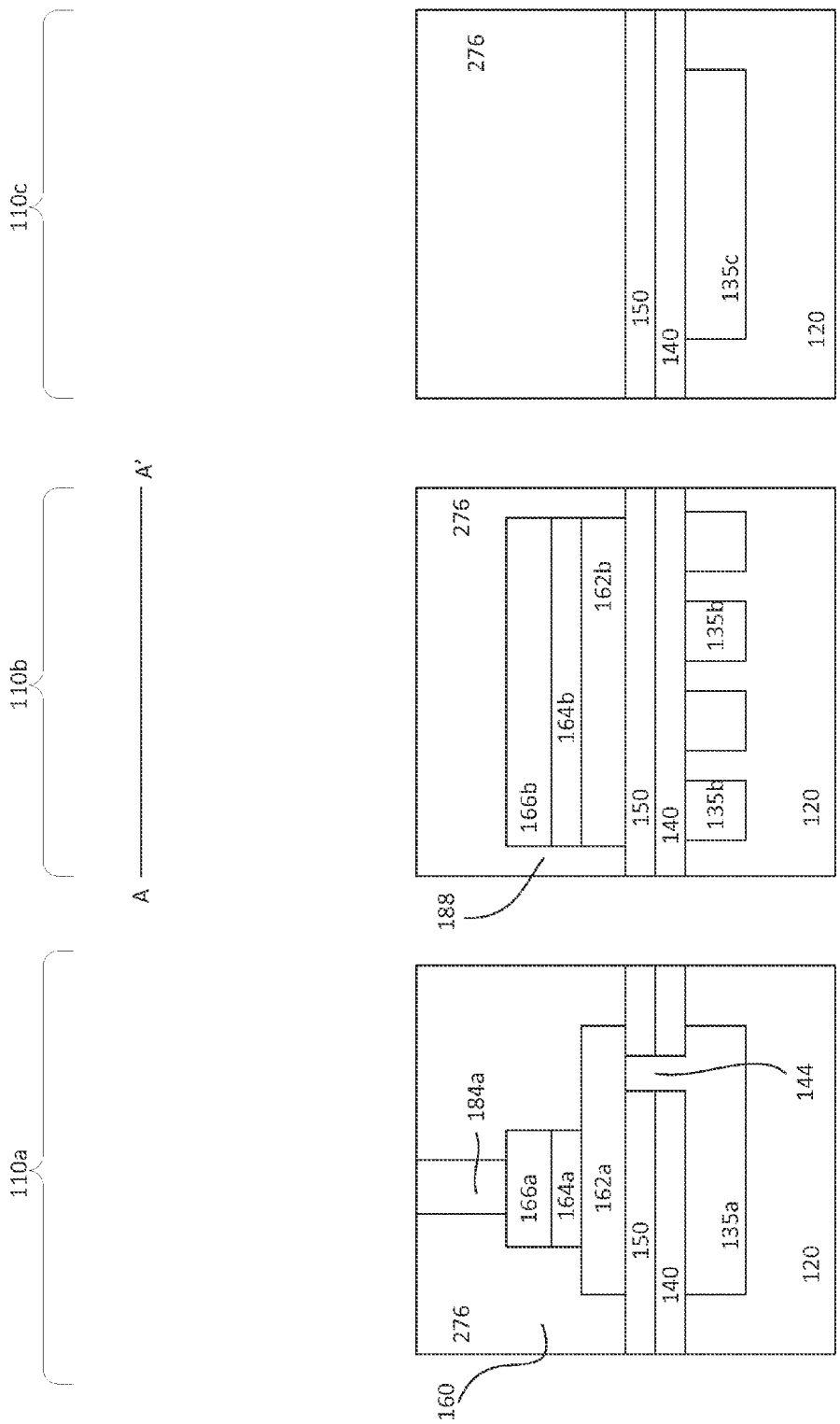

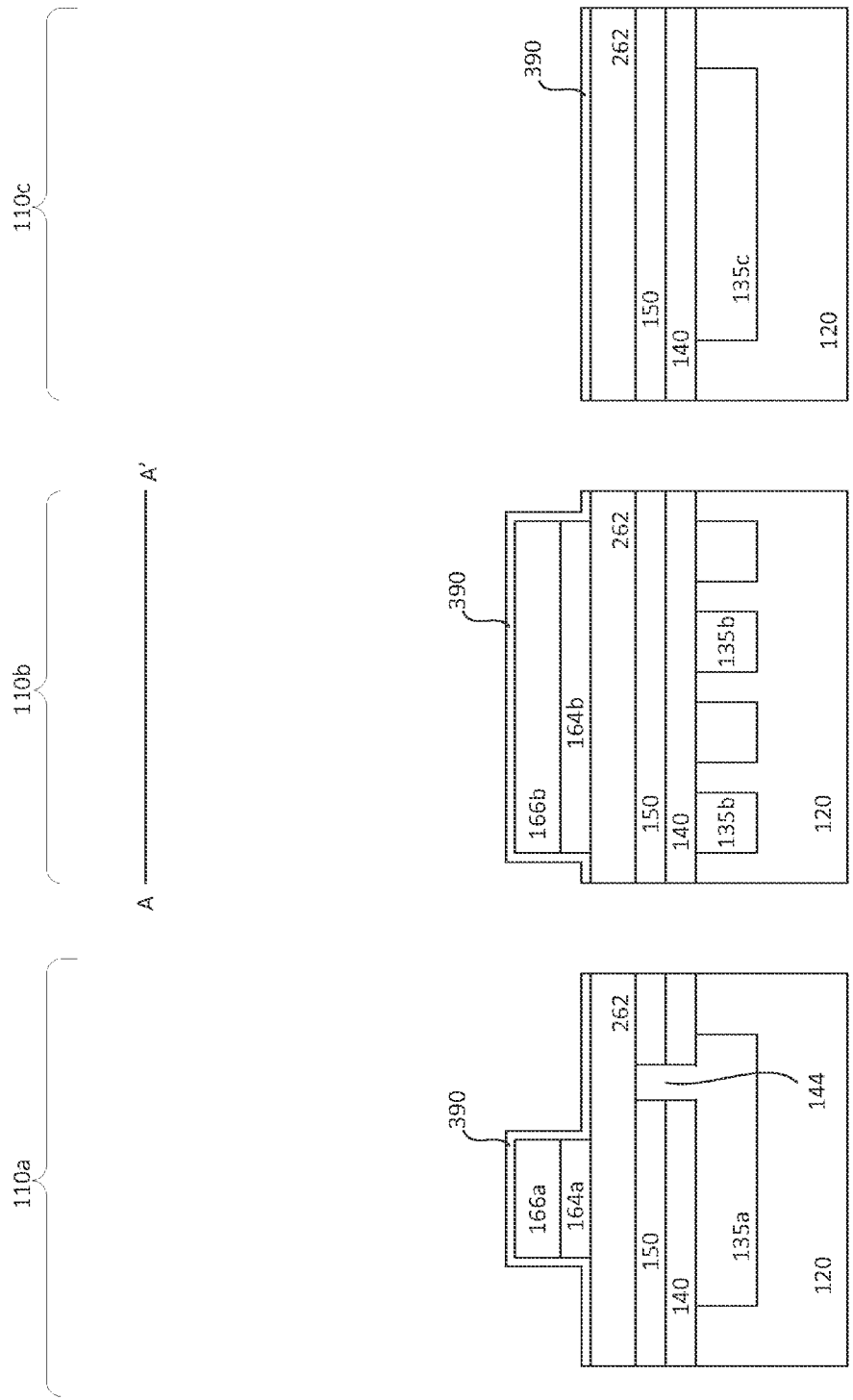

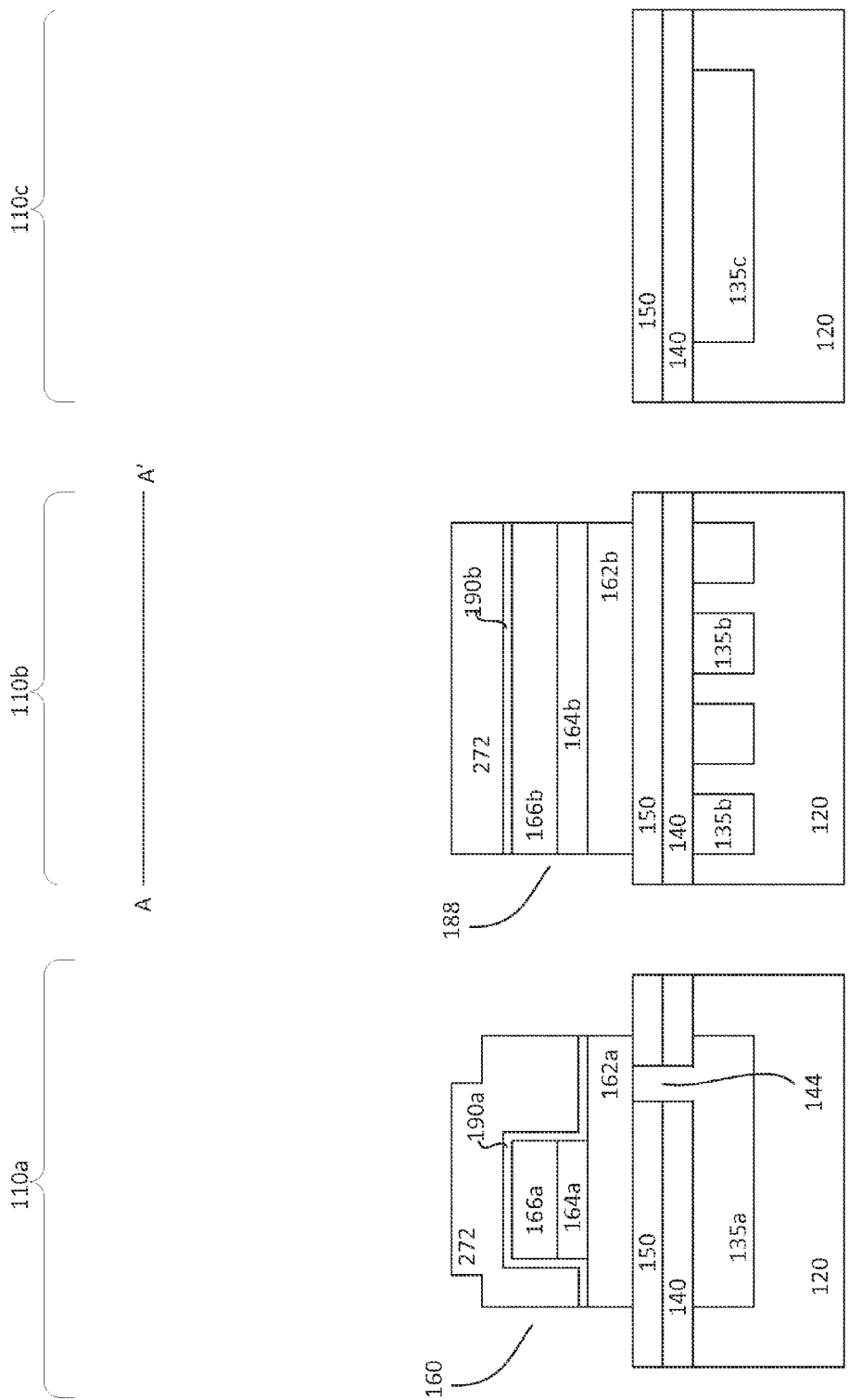

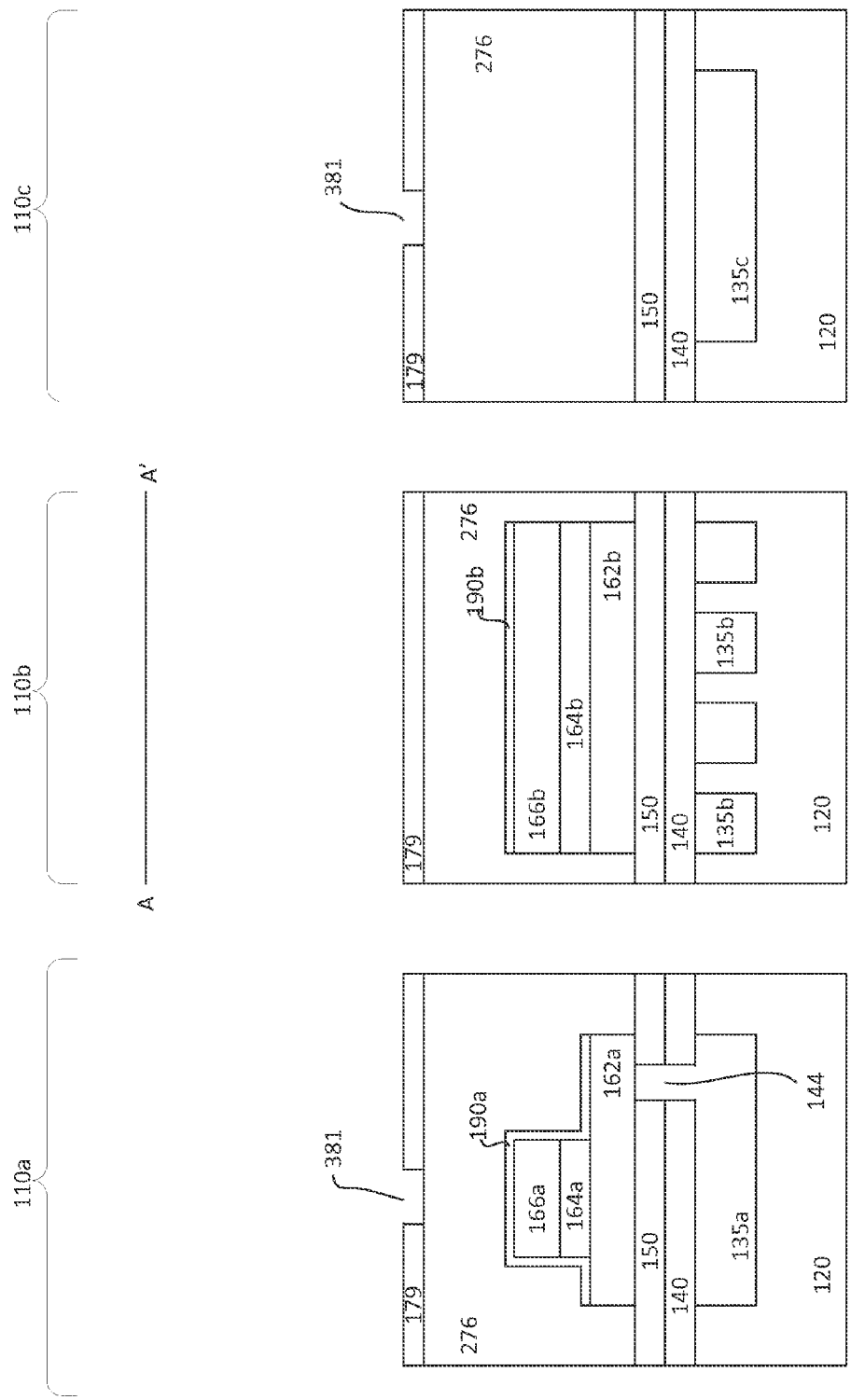

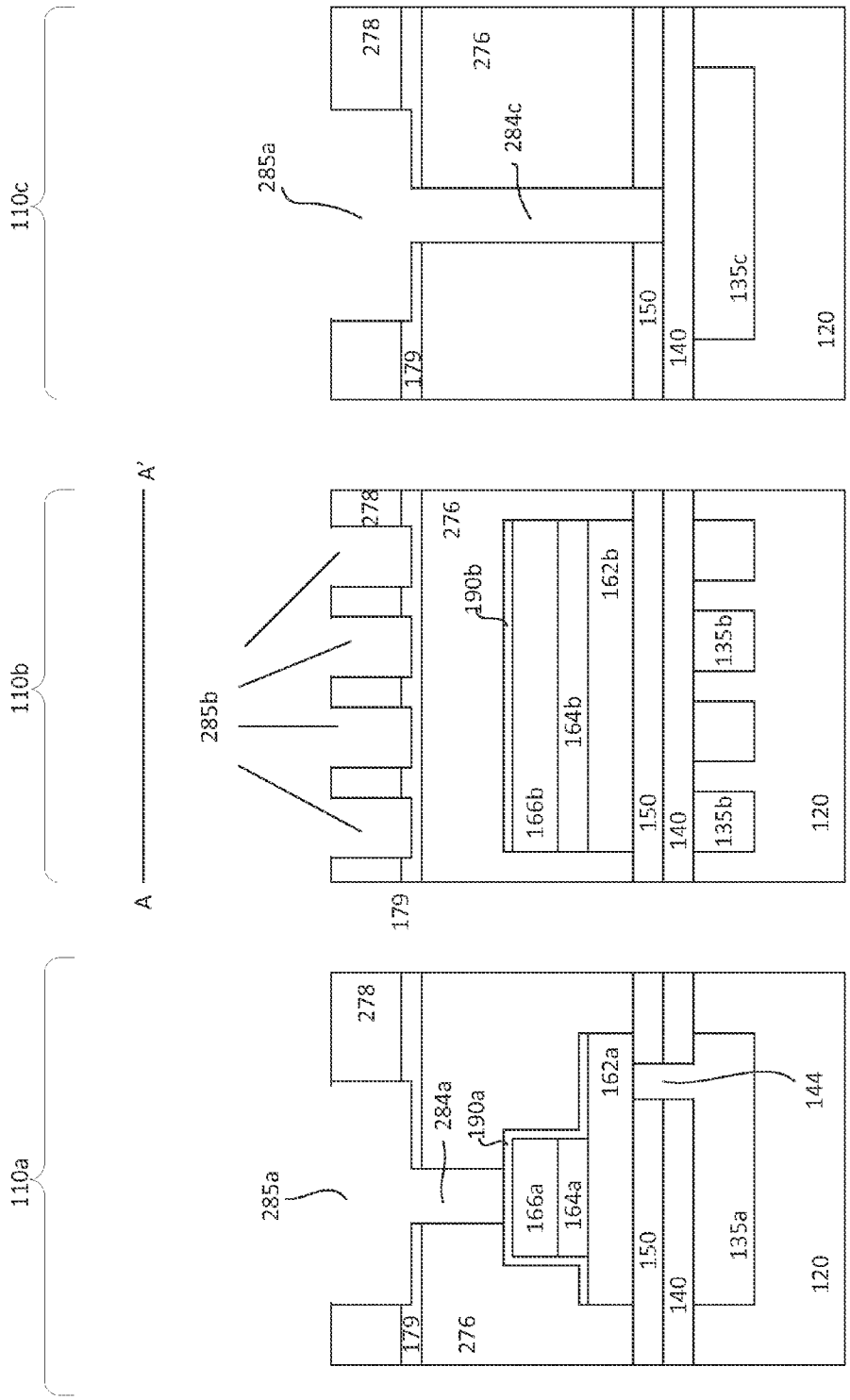

INTEGRATED INDUCTOR AND MAGNETIC RANDOM ACCESS MEMORY DEVICE

CROSS-REFERENCE TO RELATED APPLICATIONS

This application cross-references to U.S. patent application Ser. No. 14/862,180, titled "INTEGRATED MAGNETIC RANDOM ACCESS MEMORY WITH LOGIC DEVICE" that is concurrently filed and assigned to the same assignee as this application, which is herein incorporated by reference for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM uses magnetic polarization to store information. However, current MRAM is not integrated with inductor to provide for radio frequency (RF) applications. Inductor is implemented off the integrated circuit (IC) (e.g., off-chip). To accommodate the off-chip inductor, additional area is needed in the package or circuit board, increasing the overall foot print of the IC. Furthermore, off-chip inductor has corresponding manufacturing cost. Accordingly, the issues associated with off-chip inductor increase overall manufacturing costs as well as design flexibility.

It is desirable to provide device structures and methods that allow integration of inductor with MRAM and logic devices into a single chip or IC in a cost effective way.

SUMMARY

Embodiments of the present disclosure generally relate to semiconductor devices and methods for forming a semiconductor device. In one embodiment, a method of forming a device is disclosed. The method includes providing a substrate defined with at least first and second regions. A first upper dielectric layer is provided over the substrate. The first upper dielectric layer includes a first upper interconnect level with a plurality of metal lines in the first and second regions. A dielectric layer is provided over the first upper dielectric layer. The dielectric layer includes a second upper interconnect level with a plurality of metal lines in the first and second regions. A magnetic random access memory (MRAM) cell is formed. The MRAM cell is disposed between the first and second upper interconnect levels in the first region. An inductor is formed in the second region. The inductor includes a lower inductor level formed from the metal lines in the first upper interconnect level and an upper inductor level formed from the metal lines in the second upper interconnect level. The metal lines in the lower inductor level and upper inductor level are coupled by via contacts to form loops of the inductor.

In another embodiment, a device is presented. The device includes a substrate defined with at least first and second regions. A first upper dielectric layer is disposed over the substrate. The first upper dielectric layer includes a first upper interconnect level with a plurality of metal lines in the first and second regions. A dielectric layer is disposed over the first upper dielectric layer. The dielectric layer includes a second upper interconnect level with a plurality of metal lines in the first and second regions. The device includes a magnetic random access memory (MRAM) cell. The MRAM cell is disposed between the first and second upper interconnect levels in the first region. An inductor is disposed in the second region. The inductor includes a lower inductor level formed from the metal lines in the first upper interconnect level and an upper inductor level formed from the metal lines in the second upper interconnect level. The metal lines in the lower inductor level and upper inductor level are coupled by via contacts to form coils of the inductor.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIG. 1a shows cross-sectional views of memory, inductor and logic regions of an embodiment of a device;

FIG. 1b shows a top view of an inductor region of the device of FIG. 1a while FIG. 1c shows cross-sectional views of an inductor taken at A-A' and B-B' of the inductor region shown in FIG. 1b;

FIGS. 3a-3i show cross-sectional views of another embodiment of a process for forming a device.

DETAILED DESCRIPTION

Figure 1D:
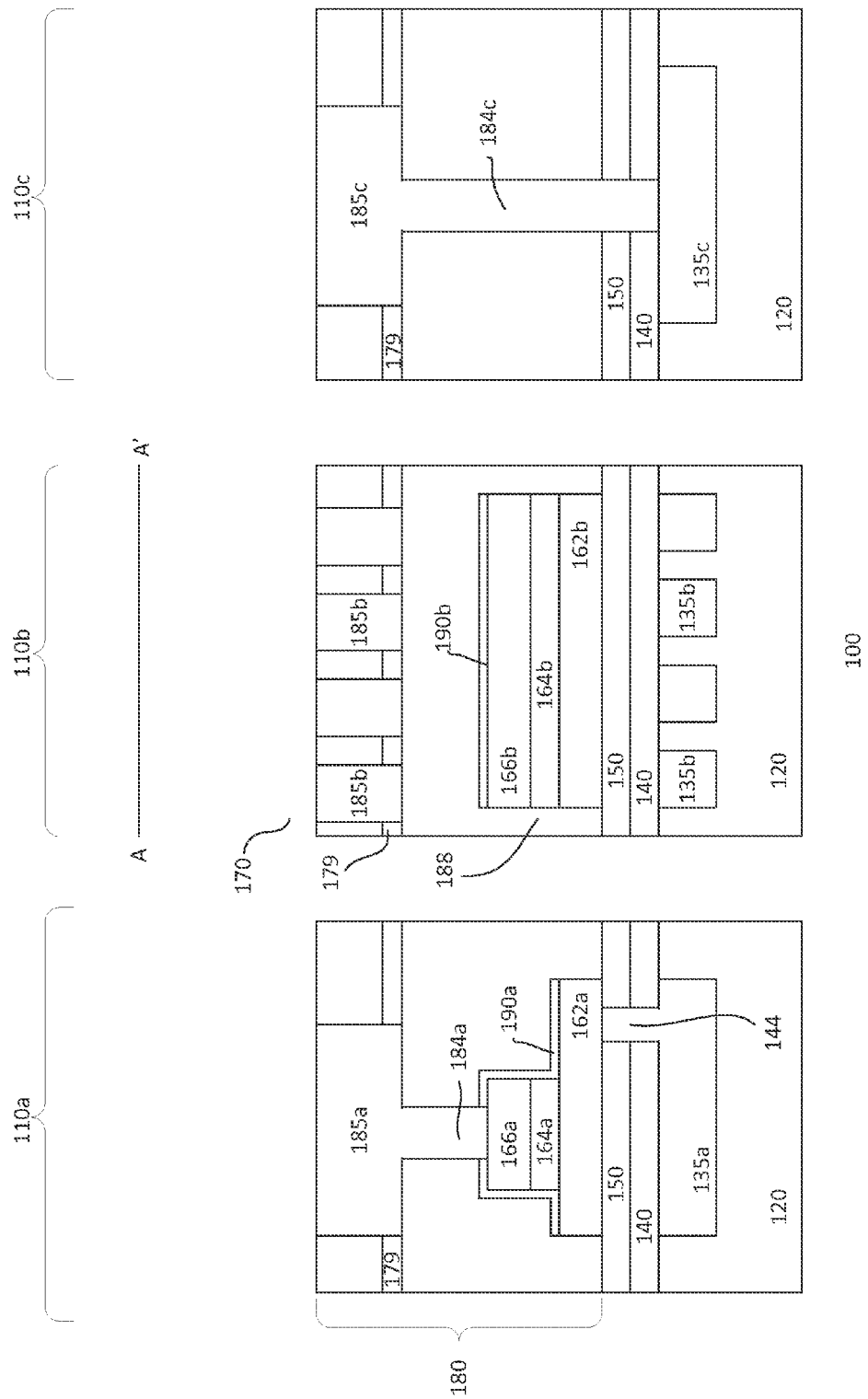
FIG. 1d shows cross-sectional views of memory, inductor and logic regions of another embodiment of a device.

Embodiments of the present disclosure generally relate to integration of memory device with magnetic inductor in an integrated circuit (IC). The memory device, for example, may be spin transfer torque magnetic random access memory (STT-MRAM) device while the inductor, for example, is a magnetic inductor. The memory device includes memory cell having magnetic tunneling junction (MTJ) element. Other suitable types of memory devices may also be useful. Such memory device together with the magnetic inductor, for example, may be used for radio frequency (RF) applications which can be incorporated into or used with, for example, consumer electronic products, or relate to other types of devices.

FIG. 1a shows cross-sectional views of first (or memory) region 110a, second (or inductor) region 110b and third (or logic) region 110c of a device 100. The cross-sectional views of the first and third regions, for example, are taken along a first direction (e.g., x direction) while the cross-sectional view of the second region is taken along a second direction (e.g., y direction) of the device. FIG. 1b shows a top view of an inductor region of the device while FIG. 1c shows cross-sectional views of an inductor taken at A-A' and B-B' of the inductor region shown in FIG. 1b.

The device 100 includes a substrate (not shown). The substrate, for example, may be a silicon substrate. Other suitable types of semiconductor substrates may also be used. The substrate may be prepared with first region 110a, second region 110b and third region 110c. The first region 110a can be referred to as a memory cell region for accommodating a memory cell of the device. The memory cell region may be part of an array region. The second region 110b can be referred to as an inductor region for accommodating an inductor structure of the device while the third region can be referred to as a logic region for accommodating logic components of the device. For simplicity, only the memory, inductor and logic regions of the device are shown. It is understood that the substrate may also be prepared with other suitable types of regions (not shown).

Front-end-of-line (FEOL) processing is performed on the substrate to form, for example, one or more components, such as transistors (not shown). After forming the transistors, back-end-of-line (BEOL) processing is performed. The BEOL process includes forming interconnects in interlevel dielectric (ILD) layers or levels. The interconnects connect the various components of the IC to perform the desired functions. An ILD level includes a metal level and a via or contact level. Generally, the metal level includes metal lines while the contact level includes via contacts. The metal lines and via contacts may be formed of a metal, such as copper, copper alloy, aluminum, tungsten or a combination thereof. Other suitable types of metal, alloys or conductive materials may also be useful. The FEOL and BEOL processings, for example, are described in concurrently filed U.S. patent application Ser. No. 14/862,180, titled "INTEGRATED MAGNETIC RANDOM ACCESS MEMORY WITH LOGIC DEVICE", which is herein incorporated by reference for all purposes.

The device may include a plurality of ILD layers or levels. For example, x number of ILD levels may be provided. For example, 5 ILD levels (x=5) may be provided. Other suitable number of ILD levels may also be useful. The number of ILD levels may depend on, for example, design requirements or the logic process involved. A metal level of an ILD level may be referred to as $M_i$, where i is in the $i^{th}$ ILD level of x ILD levels. A via or contact level of an ILD level may be referred to as $V_{i-1}$, where i is the $i^{th}$ ILD level of x ILD levels. The first metal level M1 and first contact level CA may be referred to as a lower ILD level. An upper ILD level may include ILD level 2 to ILD level x. For example, in the case where x=5 (5 levels), the upper ILD level includes ILD levels from 2 to 5, which includes M2 to M5. Designating other ILD levels as upper ILD level may also be useful.

In one embodiment, the first (or memory) region 110a accommodates a MRAM cell. The MRAM cell is generally disposed in between final metal levels of the upper ILD level. In one example, the MRAM cell is formed in between adjacent upper ILD levels, such as upper ILD level 4 to 5. It is understood that the MRAM cell may be disposed in between other suitable adjacent ILD levels. As such, for simplicity and for illustration purpose, FIG. 1a do not depict the substrate, lower ILD level and lower levels of the upper ILD level even though these layers are present in the device.

For illustration purpose, the portion of the device shown in FIG. 1a shows a dielectric layer 120 which corresponds to upper ILD level 4. The upper ILD level 4, for example, includes a via level and a metal level. The upper ILD level 4, for example, includes via level V3 and metal level M4. One or more via contacts (not shown) may be disposed in V3 in the first region 110a.

For the sake of simplicity, the dielectric layer 120 in this disclosure may be referred to as a first upper dielectric layer and its via and metal levels may be referred to as a first upper interconnect level. As shown in the first region, a metal line 135a is disposed in the metal level (e.g., M4) of the first upper dielectric layer 120. The metal line 135a, for example, is coupled to the MRAM cell which will be described later. The metal line 135a, for example, may serve as a bitline (BL) or may be used for connection purpose. Although one metal line 135a is shown, it is understood that there could be other suitable number of metal lines in the same metal level of the first region.

The metal line 135a includes a conductive material. The conductive material, for example, includes copper (Cu). Other suitable types of conductive material may also be useful. The dimensions of this metal line 135a and its underlying via contact (not shown), for example, are defined at the minimum line resolution of the lithography and etch capability for a technology process node, which may be referred to as 1X design rule. The thickness of the metal line with reference to the top surface of the first upper dielectric layer 120, for example, is about 1400 Å. The metal line 135a, for example, includes a length L1 of about 200 nm when viewed in a first or x direction as shown in FIG. 1a. L1, in one embodiment, may include the same length as the length L5 of interconnects 135c formed in the same metal level of the third (or logic) region 110c. Alternatively, L1 may be different than L5. Other suitable thickness and length dimensions may also be useful, depending on the design requirements of a technology node.

A dielectric liner 140 is disposed above the first upper dielectric layer 120 covering the metal line 135a in the first region. The dielectric liner, for example, serves as an etch stop layer. The dielectric liner may be a low k dielectric liner. For example, the dielectric liner may be nBLOK. Other suitable types of dielectric materials for the dielectric liner may also be useful.

A second upper dielectric layer 150 is disposed on the first upper dielectric layer 120. For example, the second upper dielectric layer is disposed on the dielectric liner 140. The second upper dielectric layer, in one embodiment, is TEOS. Any suitable dielectric materials and thicknesses for the second upper dielectric layer may be useful.

In the first region 110a, a MRAM cell 160 is disposed over the second upper dielectric layer 150. In one embodiment, the MRAM cell is a STT-MRAM cell. Other suitable types of memory cells may also be useful. The MRAM cell includes a storage unit which is a magnetic memory element, such as a MTJ element.

The memory element includes first and second electrodes 162a and 166a. The first electrode, for example, may be a bottom electrode while the second electrode may be a top electrode. Other configurations of electrodes may also be useful. The bottom electrode 162a of the memory element is connected to the metal line 135a through a via plug 144 which extends through the second upper dielectric layer and dielectric liner. The via plug, for example, includes a conductive material, such as Cu. Other suitable types of conductive material may also be useful.

The memory element includes a MTJ stack 164a disposed in between the top and bottom electrodes. The memory element, for example, may include a bottom-pinned MTJ element or a top-pinned MTJ element. Top and bottom refer to position of layers relative to the substrate surface. For simplicity, the MTJ stack is shown as a single layer. It is understood that the MTJ stack generally includes a magnetically fixed (pinned) layer, a tunneling barrier and a magnetically free layer. The fixed layer includes a magnetic layer and a pinning layer. The pinning layer, for example, pins the magnetization direction of the magnetic layer, forming a pinned layer.

The free layer may be CoFeB, the tunneling barrier layer may be MgO or $Al_2O_3$, and the magnetic layer may be CoFeB/Ru/CoFeB. As for the pinning layer, it may be PtMn or IrMn. The top and bottom electrodes may be Ti, TiN, Ta, TaN or other suitable metals used in the semiconductor process. Other suitable configurations or materials of memory element may also be useful.

The top electrode and the MTJ stack of the memory cell in the first region, for example, include a length dimension which is smaller than a length dimension of the bottom electrode. For example, the length of the top electrode and MTJ stack is about 85 nm while the length of the bottom electrode is about 200 nm. Other suitable length dimensions may also be useful.

In another embodiment, depending on the manufacturing process, a dielectric liner 190a may line exposed top surface of the bottom electrode 162a, side surfaces of the MTJ stack 164a and top and side surfaces of the top electrode 166a, as shown in FIG. 1d. The dielectric liner 190a, for example, serves as an etch stop layer or protective liner which protects the top electrode during processing. The dielectric liner may be a low k dielectric liner. For example, the dielectric liner may be nBLOK. Other suitable types of dielectric materials for the dielectric liner may also be useful.

A dielectric layer 180 is disposed over the second upper dielectric layer 150, covering the memory cell. The dielectric layer and the second upper dielectric layer, for example, corresponds to upper ILD level 5. The dielectric layer, for example, is a dielectric stack having one or more dielectric layers. For instance, the dielectric layer 180 may include third, fourth, fifth and sixth or other suitable number of upper dielectric layers. The dielectric layer 180 includes TEOS. Other suitable configurations and materials for the dielectric layer may also be useful. One or more dielectric liners or etch stop layers, such as dielectric liner 179, may be disposed in between the upper dielectric layers.

The dielectric layer 180, for example, includes a via contact 184a which couples a metal line 185a to the top electrode 166a of the memory cell. The metal line 185a is disposed in the metal level while the via contact is disposed in the via level of the dielectric layer 180. For simplicity, the via and metal levels of the dielectric layer 180 may be referred to as a second upper interconnect level. For example, the metal line 185a may be disposed in metal level M5 while the via contact may be disposed in via level V4. The metal line 185a, for example, may serve as a bitline (BL). Providing the bitline at other metal level may also be useful. Although one metal line 185a is shown, it is understood that there could be other suitable number of metal lines in the same metal level of the first region.

The via contact 184a, for example, may be referred to as the top via contact and the metal line 185a, for example, may be referred to as the top metal line. The dimensions of this metal line 185a and its underlying via contact 184a, for example, are defined at twice the minimum line resolution of the lithography and etch capability for a technology process node, which may be referred to as 2X design rule. For example, the thickness of the top metal line 185a, for example, may be at least 2 times greater than the thickness of the metal line 135a below. The top metal line 185a includes a thickness of, for example, about 3600 Å and having a length L3 of about 200 nm while the top via contact 184a, for example, includes a length of about 110 nm when viewed in the first or x direction as shown in FIG. 1a. L3, for example, may include the same length as the length L6 of interconnects 185c formed in logic region 110c in the same ILD level. Alternatively, L3 may be different than L6. Other suitable thickness and length dimensions may also be useful, depending on the design requirements of a technology node. The top via contact and top metal line include a conductive material, such as Cu. Other suitable configurations and conductive materials for the via contact and metal line may also be useful.

In one embodiment, the device 100 includes an inductor 170 integrated with the MRAM cell on the same substrate. The inductor, in one embodiment, is formed in the second region 110b and is concurrently formed with the MRAM cell as will be described in more detail later. Referring to the second (or inductor region) 110b, it includes common or similar features as that described for the first (or memory region) 110a. Thus, common features or elements may not be described in detail.

In the second region 110b, a plurality of metal lines 135b are disposed in the metal level (e.g., M4) of the first upper dielectric layer 120. The metal lines 135b relate to lower inductor level of the inductor structure 170. The metal lines, for example, include metal lines formed in a first slanted arrangement in a first angle (θ) when viewed from top as shown in FIG. 1b. The first angle θ, for example, may be −30° from a normal or straight line direction when viewed from top. It is to be understood that the metal lines 135b may be formed in other suitable angle from the normal direction when viewed from top. For illustration purpose, the metal lines include 4 metal lines. Other suitable number of metal lines may be disposed in the first upper dielectric layer 120 in the second region, depending on the desired inductance.

The metal lines 135b in the second region 110b include a conductive material which is the same as the metal line 135a in the first region 110a. The metal lines 135b, for example, include the same depth or thickness dimension as the metal line 135a with reference to the top surface of the first upper dielectric layer 120. As such, the material and the thickness dimension will not be described. The metal lines 135b, as shown, include a width W2. W2, for example, includes any suitable width such that the metal lines are suitable to serve as lower inductor level of an inductor. For example, W2 is about 126 nm. Other suitable width dimensions may also be useful. As shown, adjacent metal lines are isolated by dielectric material of the first upper dielectric layer 120. The width of the dielectric material in between adjacent metal lines should be sufficient to provide proper isolation.

A dielectric liner 140 is disposed above the first upper dielectric layer 120 covering the metal lines 135b of the lower inductor level in the second region. A second upper dielectric layer 150 is disposed on the dielectric liner. As shown, the same dielectric liner 140 and second upper dielectric layer 150 cover both the metal lines in the first and second regions.

In the second region, a magnetic core structure 188 is disposed over the second upper dielectric layer 150. The magnetic core structure includes first (or bottom) and second (or top) electrodes 162b and 166b and MTJ stack 164b disposed in between the top and bottom electrodes. The top and bottom electrodes and the MTJ stack of the magnetic core structure in the second region include the same materials as the top and bottom electrodes and MTJ stack of the memory element in the first region. Thus, details of these layers will not be described.

The top and bottom electrodes and the MTJ stack of the magnetic core structure in the second region, for example, include the same length dimension when viewed in the second or y direction. The length of the top and bottom electrodes and the MTJ stack in the second direction may include any suitable length dimension, depending on the number of the metal lines of the lower and upper inductor levels. The width of the top and bottom electrodes and MTJ stack when viewed in the first or x direction is about 200 nm. Other suitable width dimensions may also be useful, depending on inductor design width.

In another embodiment, depending on the manufacturing process, a dielectric liner 190b may be disposed over top surface of the magnetic core structure as shown in FIG. 1d. The dielectric liner 190b includes the same material as the dielectric liner 190a in the first region. Thus, details of these layers will not be described.

The same dielectric layer 180 is disposed over the second upper dielectric layer 150, covering the magnetic core structure in the second region 110b. A plurality of metal lines 185b separated by dielectric material of the dielectric layer 180 are disposed in the metal level (e.g., M5) of the dielectric layer 180. The metal lines 185b correspond to upper inductor level of the inductor structure. The metal lines 185b, for example, include metal lines formed in a second slanted arrangement in a second angle (θ') when viewed from top as shown in FIG. 1b. The second angle θ', for example, may be +30° from the normal or straight line direction when viewed from top. It is to be understood that the metal lines 185b may be formed in other suitable angle from the normal direction when viewed from top. For illustration purpose, the metal lines 185b include 4 metal lines. Other suitable number of metal lines may be disposed in the dielectric layer 180 in the second region, depending on the desired inductance.

The metal lines 185b in the second region include a conductive material which is the same as the metal lines 185a in the first region. The metal lines 185b in the second region, for example, include the same depth or thickness dimension as the metal line 185a in the first region with reference to the top surface of the dielectric layer 180. As such, the material and the thickness dimension will not be described. The metal lines 185b, as shown, include a width W4. W4, for example, may include the same dimension as W2 of the metal lines 135b when viewed in the second or y direction as shown in FIG. 1b. For example, W4 is about 126 nm. W4, for example, may include any suitable width such that the metal lines are suitable to serve as upper inductor level of an inductor. As shown, adjacent metal lines are isolated by dielectric material of the dielectric layer 180. The width of the dielectric material in between adjacent metal lines 185b should be sufficient to provide proper isolation.

The dielectric layer 180 in the second region also includes a plurality of via contacts 184b. As shown in FIGS. 1b and 1c, a metal line 185b includes first and second opposing ends while a metal line 135b includes first and second opposing ends. In one embodiment, the first end of an upper metal line 185b is coupled to the underlying first end of a lower metal line 135b through a via contact 184b$_1$ while the second end of the same upper metal line 185b is coupled to a second end of adjacent lower metal line 135b through a separate via contact 184b2. Thus, the metal lines 185b in the upper inductor level and the metal lines 135b in the lower inductor level coupled by the via contacts 184b$_1$ and 184b$_2$ form loops or coils of an inductor with a magnetic core structure 188 disposed in between the loops. A 3-D inductor with a magnetic core structure is disposed in between adjacent metal levels or inter level metal.

As for the third (or logic region) 110c, it includes common or similar features as that described for the first and second regions. Thus, common features or elements may not be described in detail.

In the third region 110c, a metal line 135c is disposed in the metal level (e.g., M4) of the first upper dielectric layer 120. The metal line 135c may be referred to as a lower interconnect of the upper ILD levels in the third region. The metal line 135c may be coupled to contact regions of logic transistor (not shown) disposed on the substrate. Although one metal line 135c is shown, it is understood that there could be other suitable number of metal lines in the same metal level of the third region. The metal line 135c, for example, may include a length L5 and depth dimensions which are the same as the length L1 of metal line 135a formed in the first (or memory) region 110a. Alternatively, L5 may be different than L1. Other suitable thickness and length dimensions may also be useful.

As shown in the third region 110c, the dielectric layer 180 also includes a metal line 185c in the metal level and a via contact 184c disposed in the via level of the dielectric layer 180. For example, the metal line 185c may be disposed in metal level M5 while the via contact 184c may be disposed in via level V4. Although one metal line 185c is shown, it is understood that there could be other suitable number of metal lines.

The via contact 184c, for example, may be referred to as the top via contact and the metal line 185c, for example, may be referred to as the top metal line. The thickness of the top metal line 185c, for example, may be at least 2 times greater than the thickness of the metal line 135c below. The length L6 of the top metal line 185c, for example, may be the same or different than the length L3 of the metal lines 185a formed in memory region 110a in the same ILD level. Other suitable thickness and length dimensions may also be useful. The top via contact 184c, as shown in FIG. 1a, couples the metal line 185c in upper metal level to the metal line 135c in lower metal level. The top via contact 184c, for example, extends through the second upper dielectric layer 150 and dielectric liner 140.

A pad level (not shown) is disposed over the dielectric layer 180. The pad level includes pad interconnects (not shown). For example, pad interconnects are coupled to the metal lines in the upper metal level. The pad interconnects provide external connections to the device.

Figure 2B:
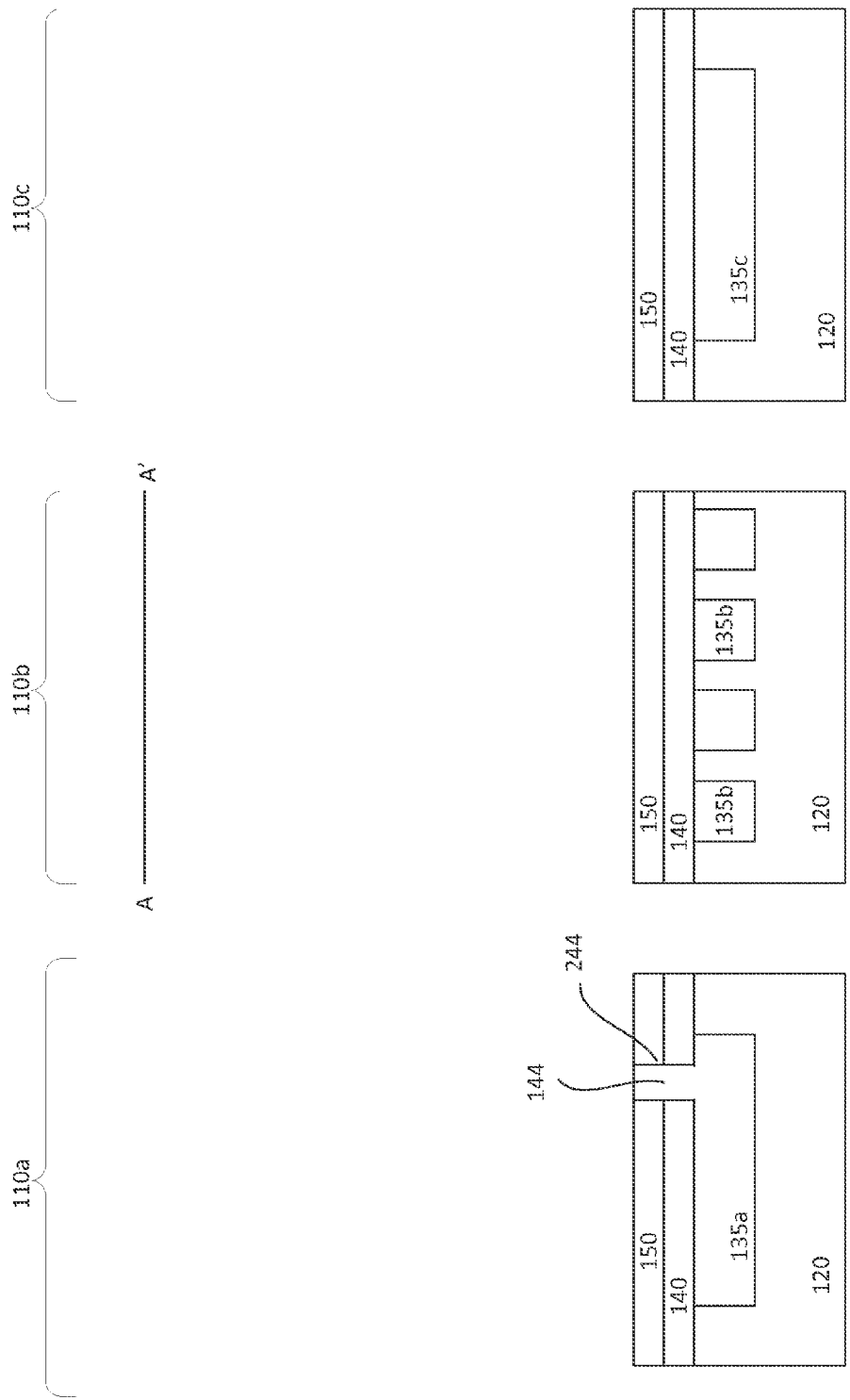
FIGS. 2a-2o show cross-sectional views of an embodiment of a process for forming a device.
Figure 2C:
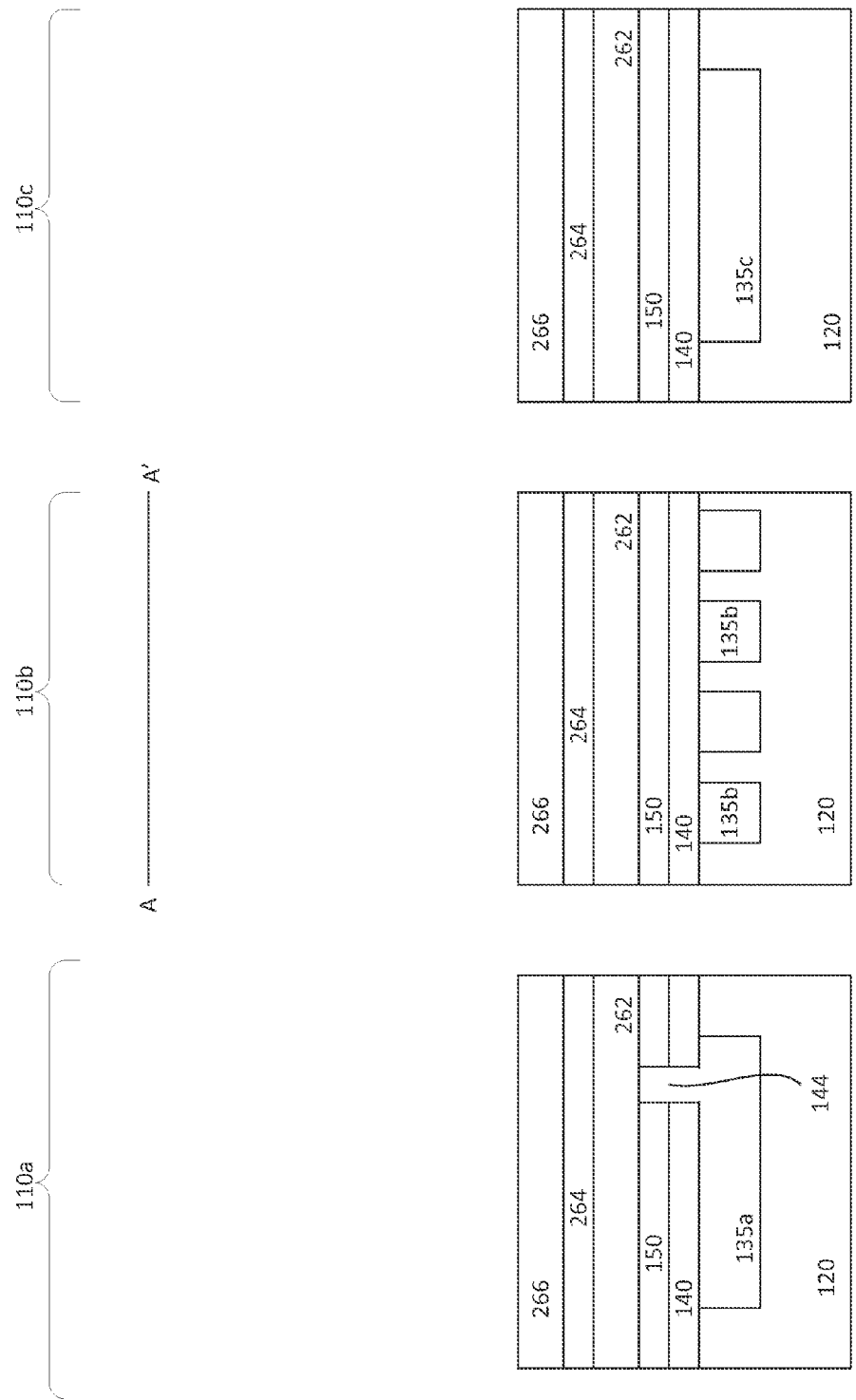
Figure 2D:
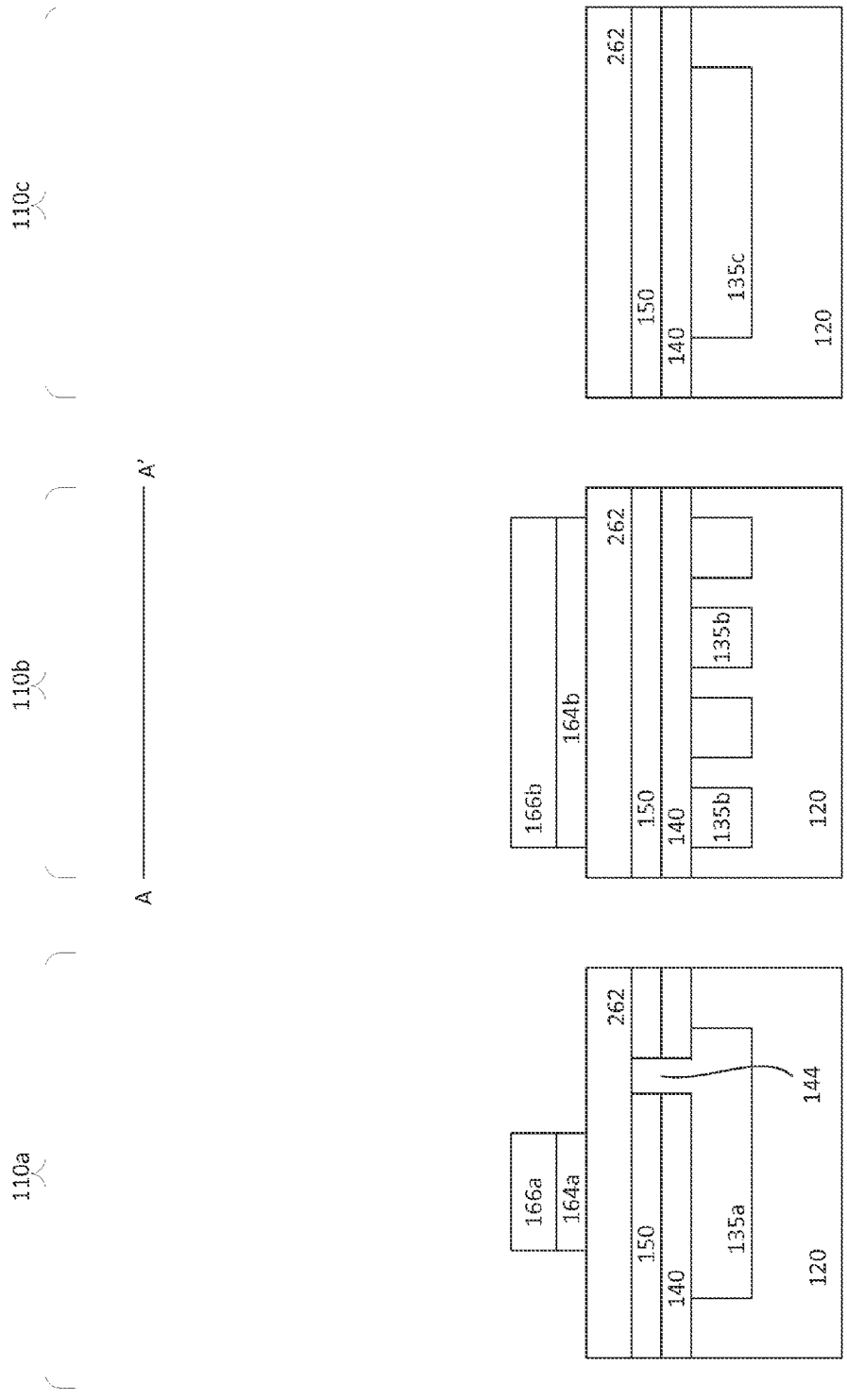
Figure 2F:
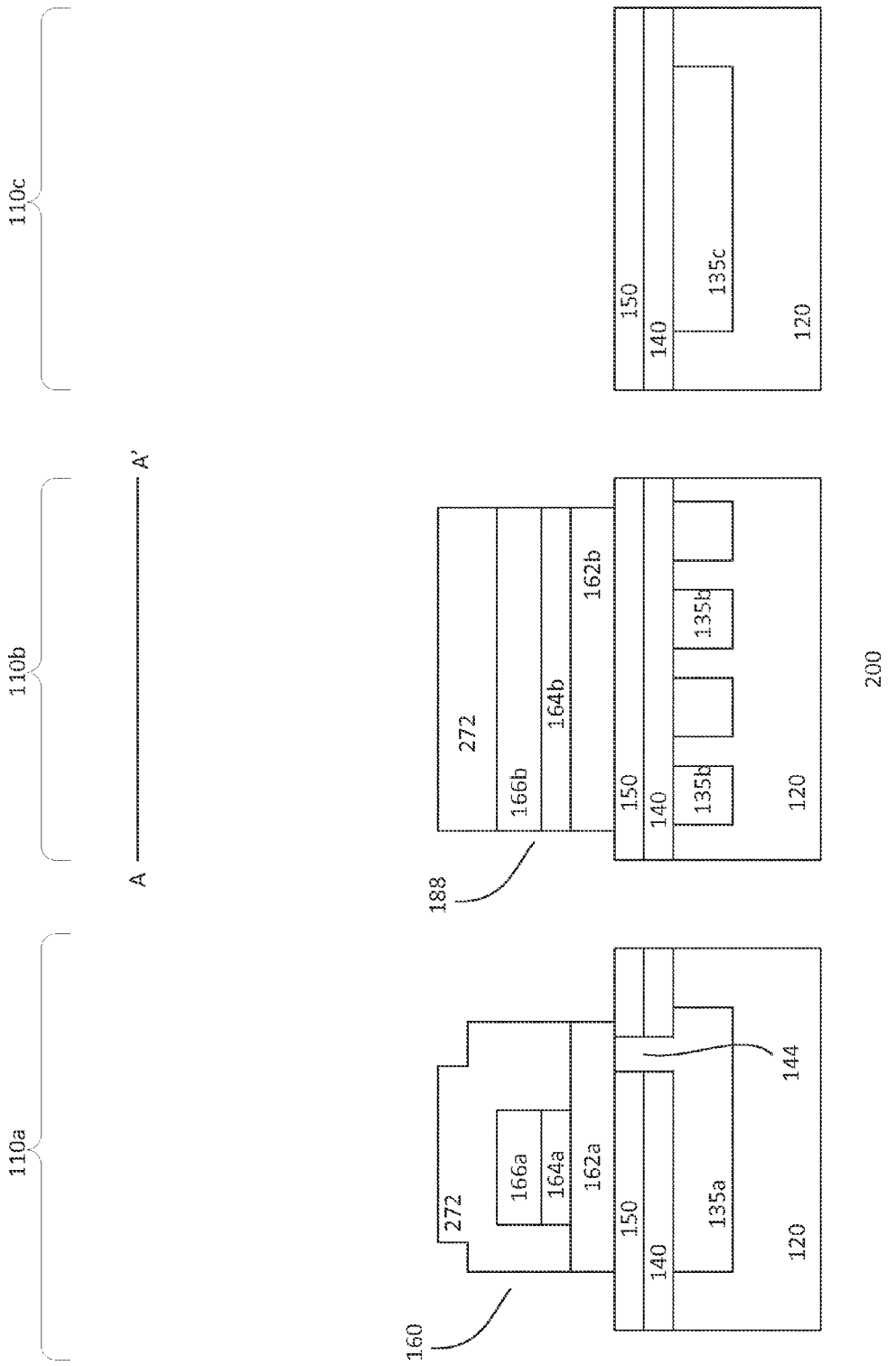
Figure 2G:
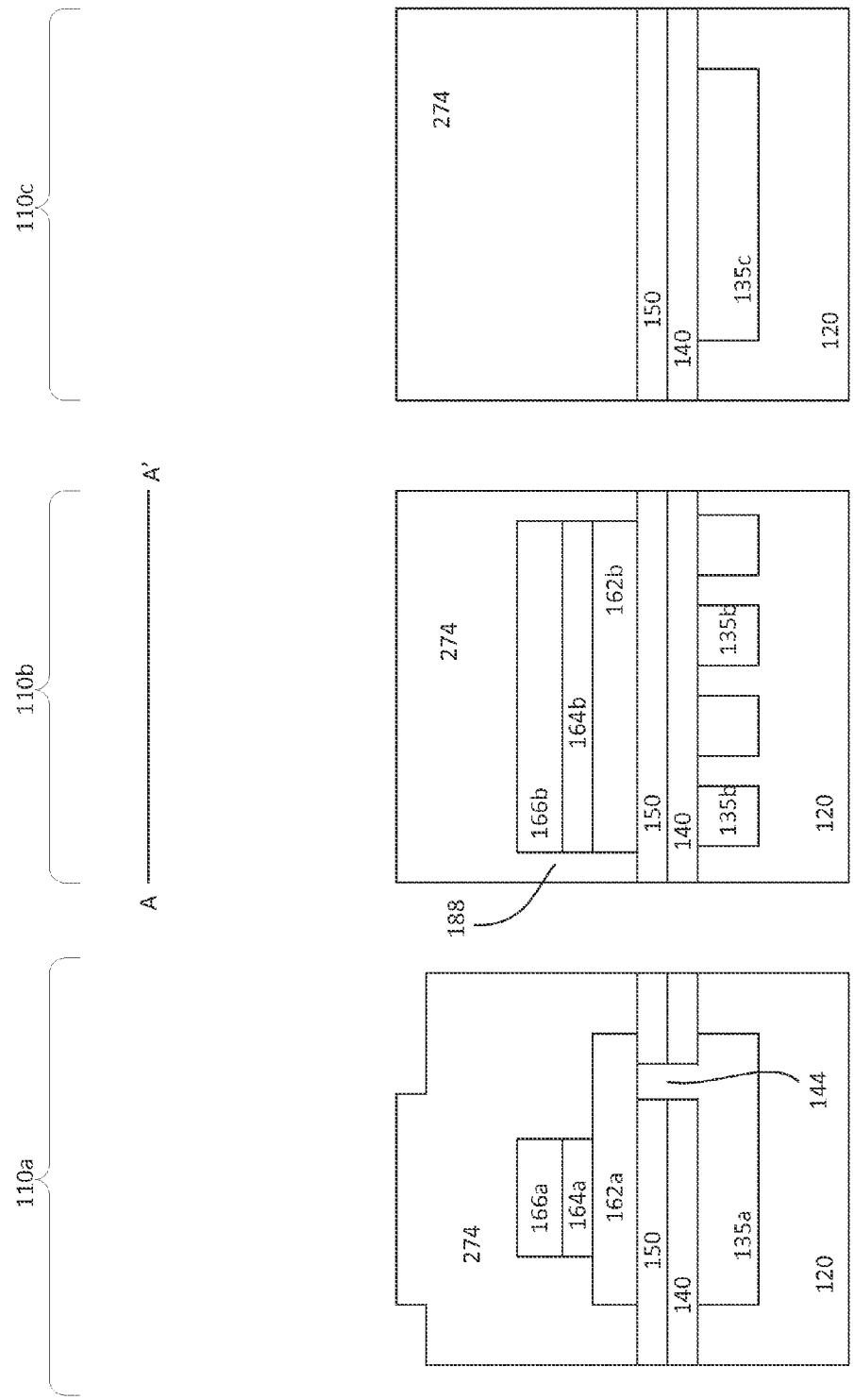
Figure 2I:
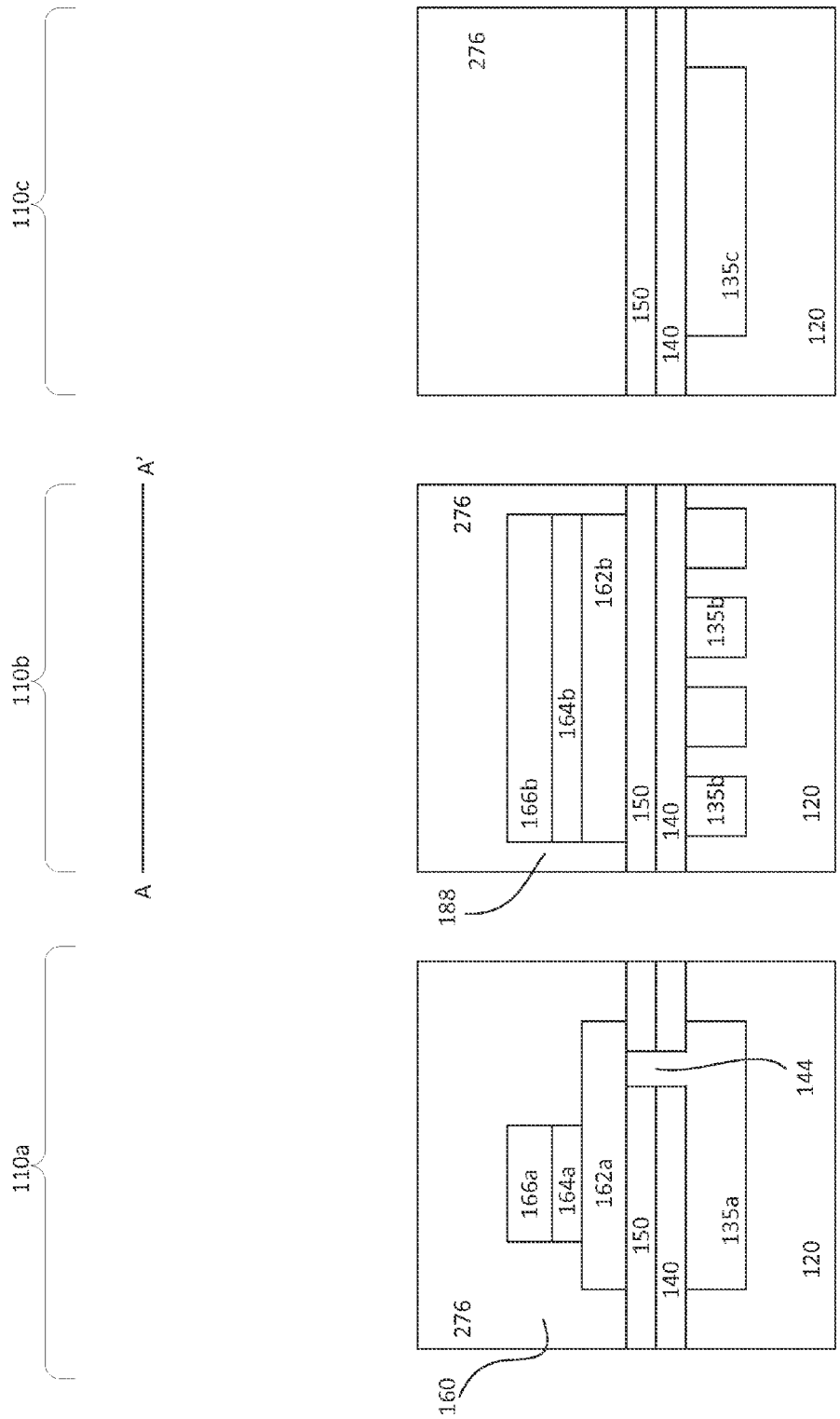
Figure 2J:
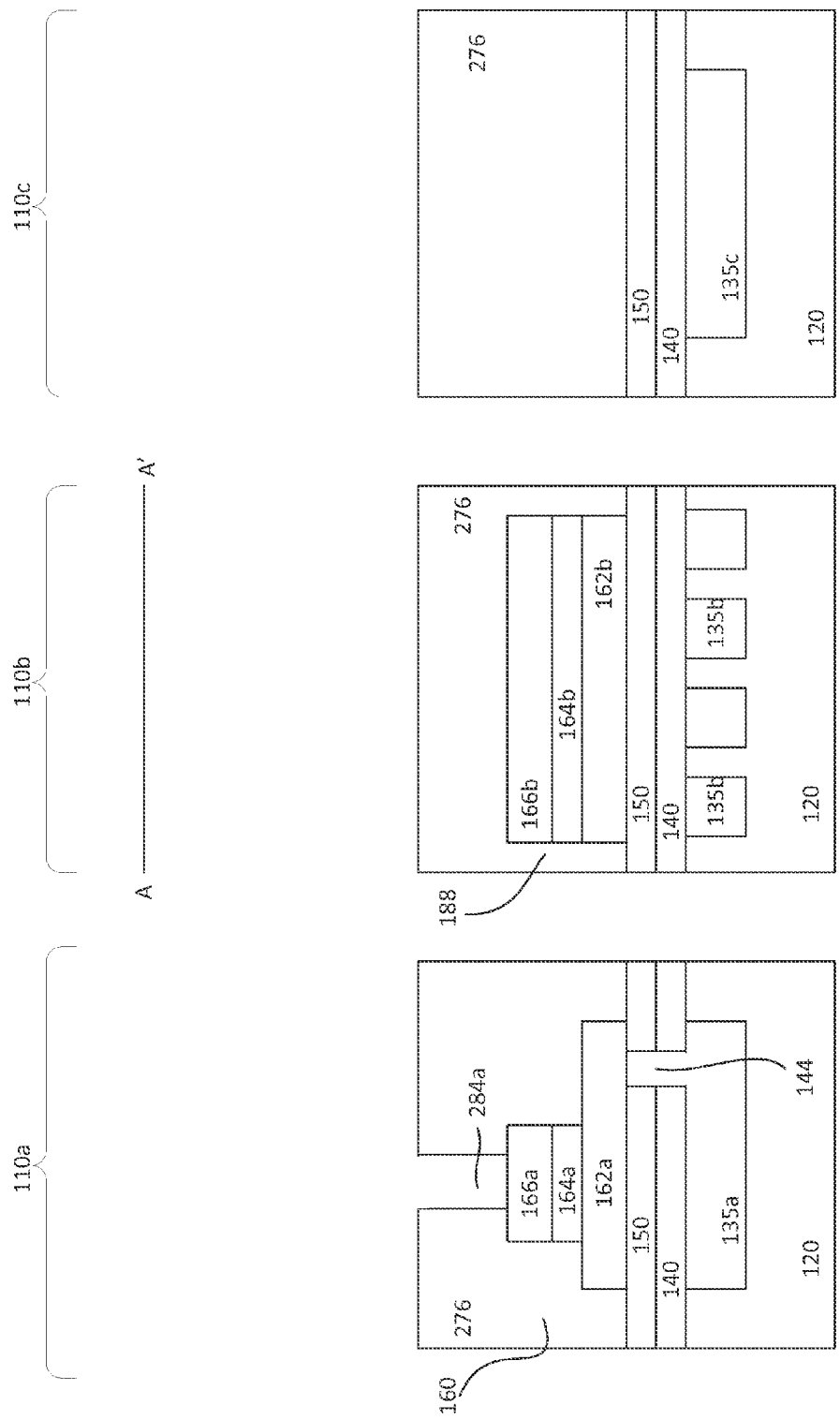
Figure 2:
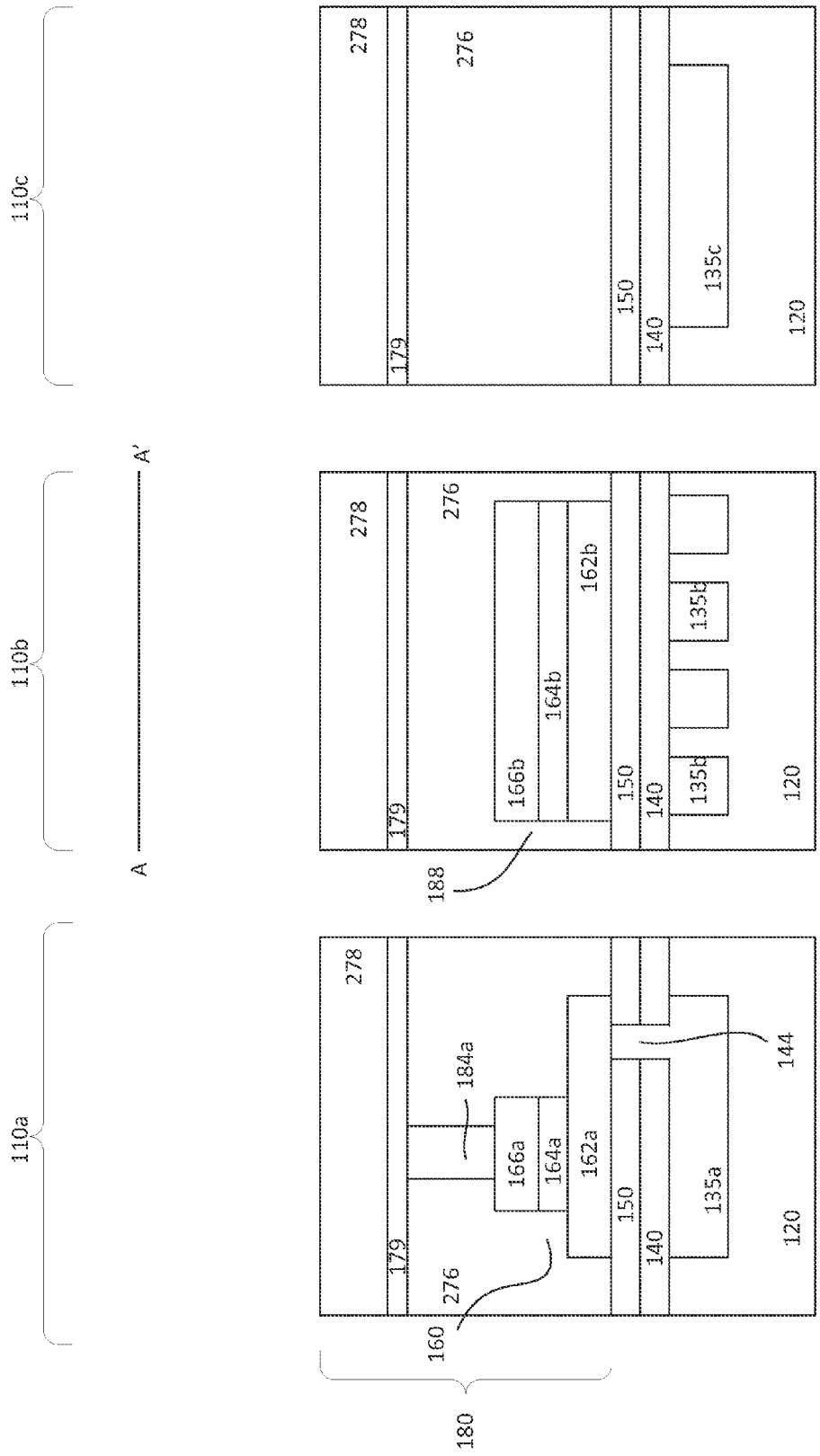
Figure 2M:
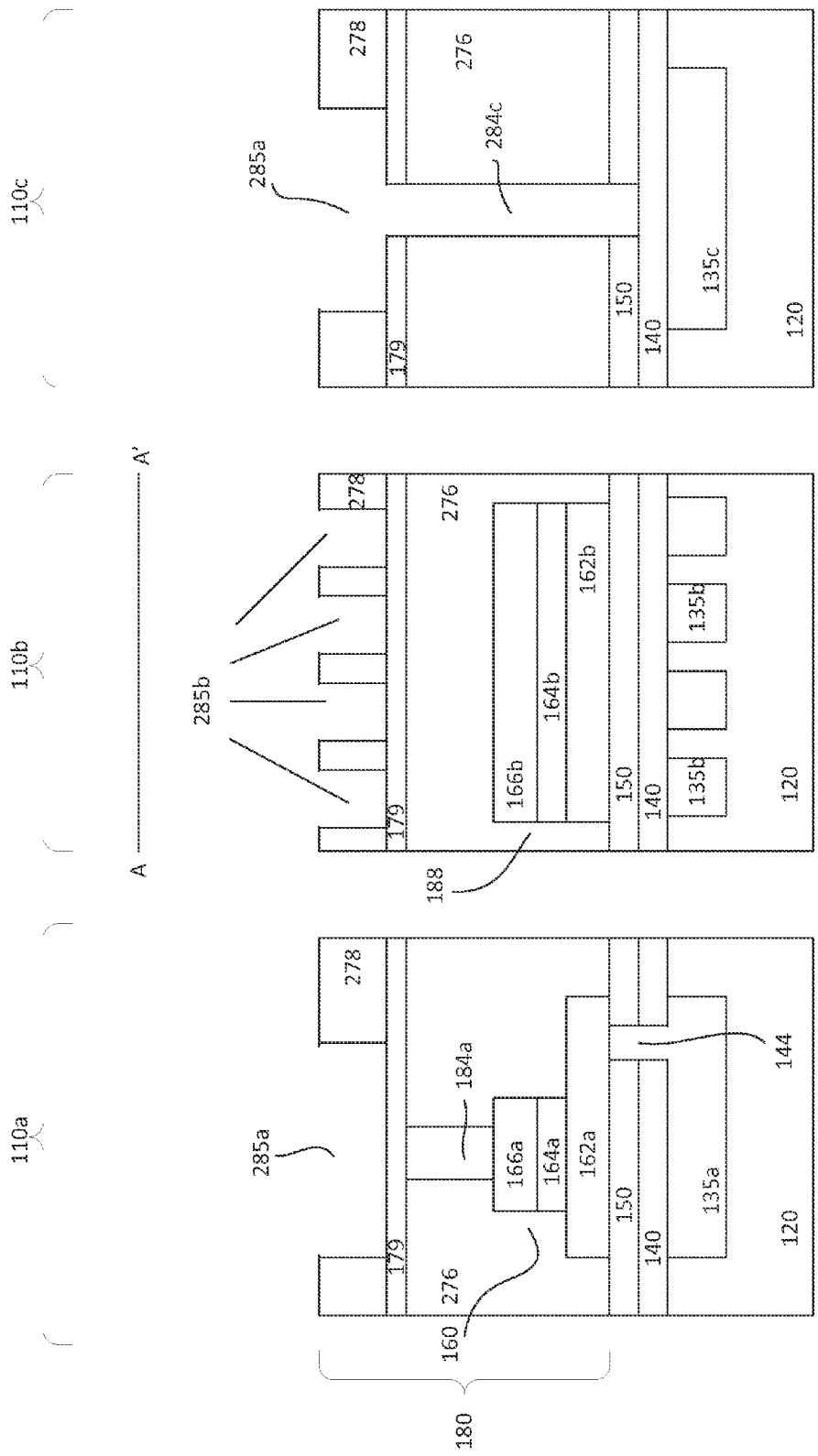
Figure 2N:
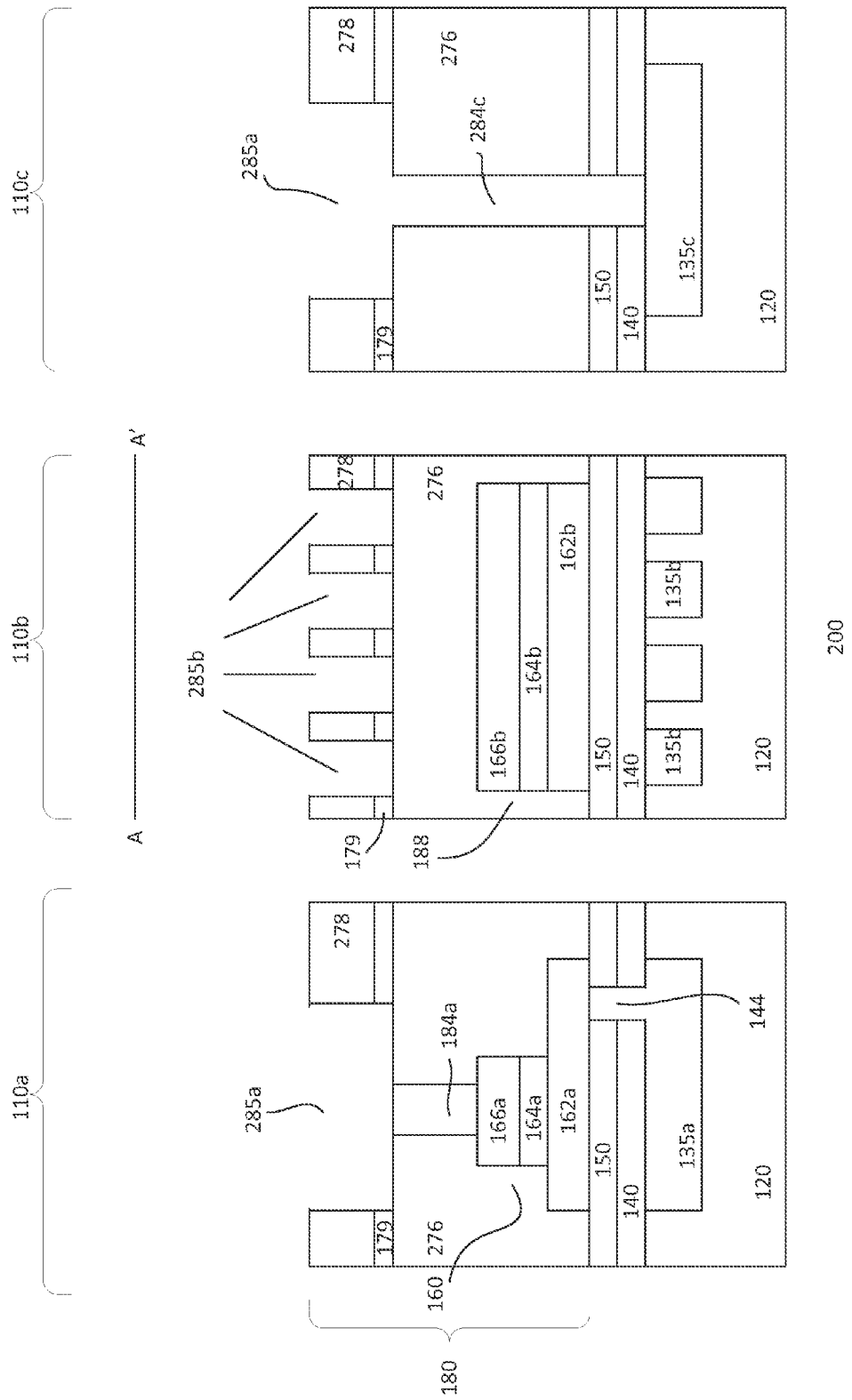
Figure 2O:
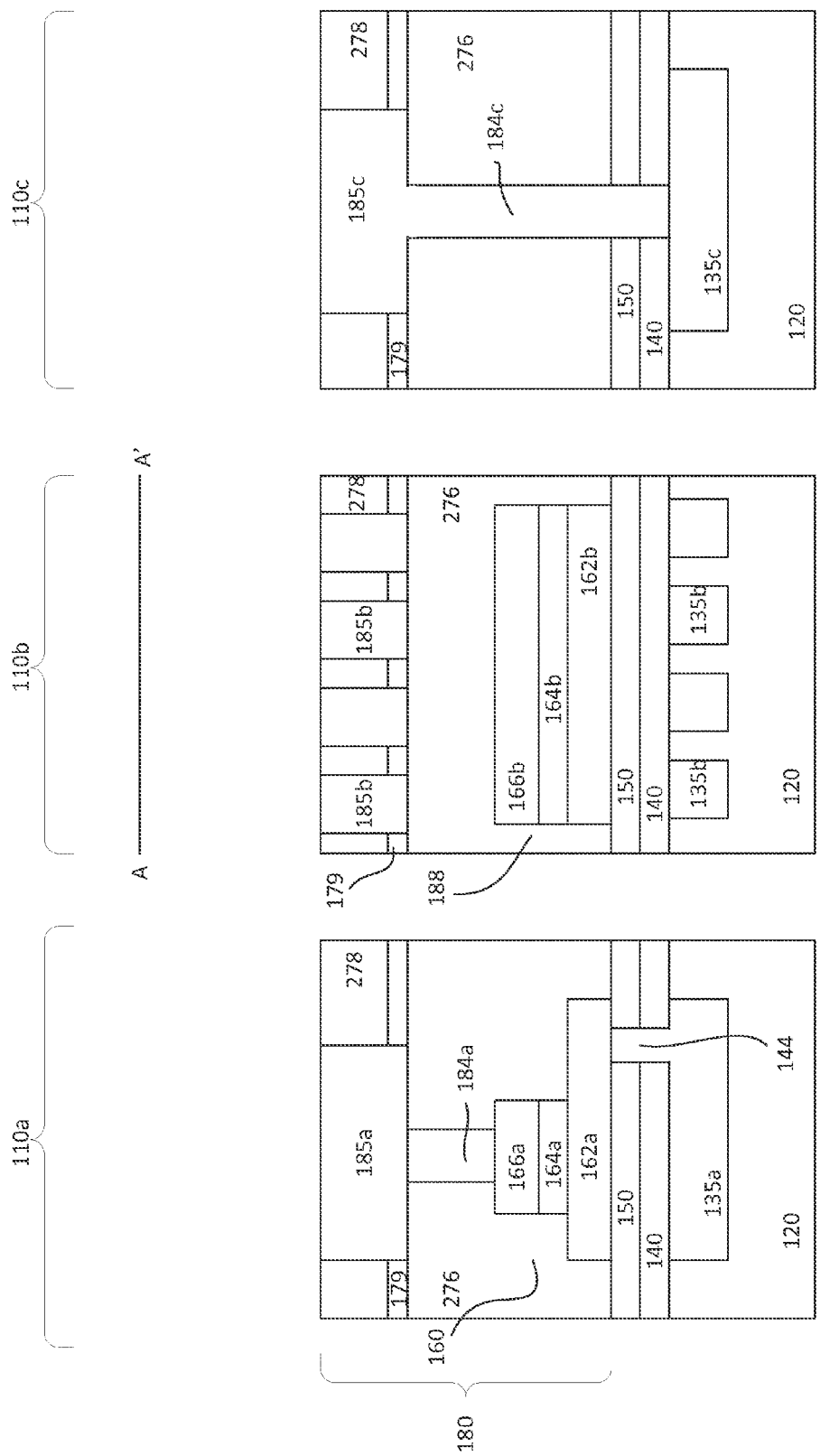

FIGS. 2a-2o show simplified cross-sectional views of a process 200 for forming an embodiment of a device. In one embodiment, the process allows a memory cell and an inductor to be formed simultaneously on the same substrate using logic processing. The memory cell, for example, may be a MRAM cell while the inductor, for example, is a magnetic inductor. The MRAM, in one embodiment, is a STT-MRAM cell. The device formed, for example, is similar to that shown and described in FIGS. 1a-1c. Common elements may not be described or described in detail.

For simplicity, the processing of a substrate to form transistors using FEOL and processing of lower ILD level and lower levels of an upper ILD level using BEOL are not shown. Referring to FIG. 2a, the process 200 is at the stage of providing a dielectric layer 120 over a substrate (not shown). The dielectric layer 120, for example, may correspond to upper ILD level 4. For the sake of simplicity and for illustration purpose, the dielectric layer 120 may be referred to as a first upper dielectric layer and its via and metal levels may be referred to as a first upper interconnect level.

The process includes forming suitable via openings (not shown) and trenches in the first (or memory) region 110a, second (or inductor) region 110b and third (or logic) region 110c. First type trenches 235a are formed in the first and third regions 110a and 110c while second type trenches 235b are formed in the second region 110b. A photoresist (not shown) is applied to the top surface of the first upper dielectric layer to define a pattern arrangement for fabricating the first and second type trenches. The second type trenches, for example, include trenches formed in a first slanted arrangement in a first angle (θ) when viewed from top. The first angle θ, for example, may be −30° from a normal or straight line direction when viewed from top. It is to be understood that the second type trenches may be formed in other suitable angle from the normal direction when viewed from top. Portions of the first upper dielectric layer not protected by the photoresist are removed (e.g., by using an etching process) to form the first and second type trenches. The etching process, for example, may be an anisotropic etch, such as reactive ion etch (RIE). Other suitable removal process may also be employed.

In one embodiment, the first and second type trenches in the first, second and third regions are formed simultaneously. The first and second type trenches, for example, include the same depth dimension defined by, for example, 1X design rule. The depth of the first and second type trenches, for example, is about 1400 Å with reference to the top surface of the first upper dielectric layer. The first type trench includes a length L1. L1, for example, includes any suitable length which may be the same or different than the length L5 of interconnects formed in the logic region. The second type trench includes a width W2 which can be any suitable width to accommodate metal line which serves as lower inductor level of an inductor. For example, L1 is about 200 nm and W2 is about 126 nm. Other suitable dimensions may also be useful, depending on design requirement of a technology node.

The process continues by depositing a conductive layer on top of the first upper dielectric layer and fills the first and second type trenches. The conductive layer, for example, may be formed by chemical vapor deposition (CVD). The conductive layer, for example, includes Cu. Other suitable conductive materials and deposition techniques may also be employed. A chemical mechanical polishing (CMP) process is performed to remove excess conductive material on top of the first upper dielectric layer and to provide a substantially planar surface. The first type trenches filled with conductive material forms a metal line 135*a* in the first region and a metal line 135*c* in the third region. Although one metal line is shown in the first region and the third region, it is understood that there could be more than one metal line being formed. The metal line 135*a* may be coupled to a MRAM cell which will be formed in the first region while metal line 135*c* correspond to an interconnect in a metal level in the third region. The second type trenches filled with conductive material form metal lines 135*b* corresponding to lower inductor level of the inductor. As shown, the process forms metal lines 135*a*, 135*b* and 135*c* simultaneously in a metal level (e.g., M4) of the device.

Referring to FIG. 2*a*, a dielectric liner 140 is formed above the first upper dielectric layer covering metal lines 135*a*, 135*b* and 135*c* in the first, second and third regions. The dielectric liner, for example, serves as an etch stop layer. The dielectric liner may be a low k dielectric liner. For example, the dielectric liner may be nBLOK. Other suitable types of dielectric materials for the dielectric liner may also be useful. The dielectric liner, for example, is formed by CVD. Other suitable techniques for forming the dielectric liner may also be useful.

The process continues to form a second upper dielectric layer 150. As shown in FIG. 2*b*, a second upper dielectric layer 150 is formed on the first upper dielectric layer. For example, the second upper dielectric layer is formed on the dielectric liner 140. The second upper dielectric layer, in one embodiment, is tetraethyl orthosilicate (TEOS). The second upper dielectric layer may be formed by CVD. Any other suitable forming techniques or suitable materials and thicknesses for the second upper dielectric layer may also be useful.

In FIG. 2*b*, the second upper dielectric layer 150 and the dielectric liner 140 in the first region are patterned to form a via opening 244. The via opening, for example, exposes a portion of the metal line 135*a* in the metal level below. The opening may be formed by mask and etch techniques. For example, a patterned photoresist mask may be formed over the second upper dielectric layer, serving as an etch mask. An etch, such as RIE, may be performed to pattern the second upper dielectric layer and dielectric liner using the patterned resist etch mask. In one embodiment, the etch transfers the pattern of the mask to the second upper dielectric layer, including the dielectric liner to expose a portion of the metal line 135*a* below.

The process continues by depositing a conductive layer in the via opening 244. The conductive layer, for example, may include Cu and may be formed by CVD. Other suitable conductive materials and deposition techniques may also be employed. A CMP process is performed to remove excess conductive material on top of the second upper dielectric layer and to provide a substantially planar surface. The via opening 244 filled with conductive material forms a via plug 144.

The process continues to form a MRAM cell. Various layers are formed on the second upper dielectric layer 150 as shown in FIG. 2*c*. For example, various layers of memory element of the MRAM cell are sequentially formed over the second upper dielectric layer in both the first, second and third regions. A bottom electrode layer 262 is deposited over the second upper dielectric layer in the first, second and third regions. The process continues to form various layers of the MTJ stack 264 and top electrode layer 266 over the bottom electrode layer by physical vapor deposition (PVD) process. Other suitable techniques may be used. Materials of the top and bottom electrode layers and MTJ stack are the same as that described in FIGS. 1*a*-1*c*.

The process continues to pattern the top electrode layer and one or more layers of the MTJ stack as shown in FIG. 2*d*. Patterning the layers may be achieved with mask and etch techniques. As shown in FIG. 2*d*, a patterned mask (not shown) is used define the MTJ stack 164*a* and top electrode 166*a* of the memory cell while removing portions of the layers of the MTJ stack and top electrode layer not protected by the mask in the first region. As shown, the top electrode layer and the layers of the MTJ stack are removed from the third region while portions of the top electrode 166*b* and the MTJ stack 164*b* remain in the second region. The patterned mask is removed thereafter. Other suitable techniques for patterning the MTJ stack and top electrode layer may also be useful. The etch stops on top of the bottom electrode layer. As shown, the bottom electrode layer 262 remains unetched in the first, second and third regions. In other embodiments, the etch removes upper layers (e.g., upper tunnel barrier and free layer) of the MTJ stack and may stop when it reaches lower layers (e.g., lower tunnel barrier and fixed layer) of the MTJ stack.

Referring to FIG. 2*e*, a third upper dielectric layer 272 is formed. The third upper dielectric layer is formed over the bottom electrode layer and sufficiently covers the patterned MTJ stack and top electrode layer in the first and second regions. The third upper dielectric layer, for example, is TEOS. The third upper dielectric layer may be formed by CVD. Other suitable dielectric materials and techniques may be used for forming the third upper dielectric layer.

In FIG. 2*f*, the process continues to pattern the third upper dielectric layer and the bottom electrode layer. Patterning the layers may be achieved by mask and etch techniques. The patterning process defines the bottom electrode 162*a* of the memory cell in the first region while removing portions of the bottom electrode layer not protected by the mask in the second region. The bottom electrode layer 262 and the third upper dielectric layer 272 in the third region are completely removed. The etch stops when it reaches top surface of the second upper dielectric layer 150. As shown in FIG. 2f, the bottom electrode 162a of the memory cell in the first region includes a length which is greater than the length of the MTJ stack 164a and top electrode 166a in the first or x direction such that it is easy for process control and to prevent electrical short between the top and bottom electrodes. In other embodiments, the lower layers of the MTJ stack and bottom electrode include a length greater than the length of upper layers of the MTJ stack and top electrode to prevent electrical shorts between the free and fixed layers of the MTJ stack and to prevent electrical shorts between the top and bottom electrodes. As for the layers in the second region, the bottom electrode 162b includes a width which is substantially the same as the width of the MTJ stack 164b and top electrode 166b when viewed in the second or y direction. The patterned top and bottom electrodes and the MTJ stack present in the second region, as shown, provides a magnetic core 188 for the inductor. The patterned third dielectric layer 272, as shown, covers the top electrode, MTJ stack and top surface of the bottom electrode in the first region while covering the top surface of the top electrode in the second region. The mask is removed thereafter.

As shown, the MTJ stack and the top and bottom electrode layers are patterned in such a way that the bottom electrode and the MTJ stack are aligned and properly coupled to the via plug 144 in the first region 110a. This may be achieved using various techniques, including the alignment techniques as described in concurrently filed U.S. patent application Ser. No. 14/862,173, titled "MAGNETIC TUNNEL JUNCTION STACK ALIGNMENT SCHEME", which is herein incorporated by reference for all purposes. Other suitable techniques for patterning the layers and to ensure that the bottom electrode and MTJ stack align and properly couple to the underlying via plug 144 in the first region may also be useful.

A fourth upper dielectric layer 274 is formed on the substrate, as shown in FIG. 2g. The fourth upper dielectric layer is formed over the second upper dielectric layer 150 and sufficiently covers the patterned MTJ stack and top and bottom electrodes in the first and second regions. The fourth upper dielectric layer, for example, is TEOS. The fourth upper dielectric layer may be formed by CVD. Other suitable dielectric materials and techniques may be used for forming the fourth upper dielectric layer.

A planarization process is performed to remove excess fourth upper dielectric layer. The planarization process, for example, may be achieved by CMP. Other suitable techniques may also be useful. The planarization process produces a substantially planar top surface between the top surface of the top electrode and fourth upper dielectric layer 274 as shown in FIG. 2h. As shown, the planarized fourth upper dielectric layer 274 surrounds and covers the sides of the memory element 160 and magnetic core 188 in the first and second regions.

As shown in FIG. 2i, the process continues to form a fifth upper dielectric layer 276. The fifth upper dielectric layer is formed over the fourth upper dielectric layer 274 and sufficiently covers the top surface of the top electrode in the first and second regions. The fifth upper dielectric layer, for example, is TEOS. The fifth upper dielectric layer may be formed by CVD. Other suitable dielectric materials and techniques may be used for forming the fifth upper dielectric layer.

The dielectric layer is processed to form one or more via openings in the first region as shown in FIG. 2j. In one embodiment, the via openings may be referred to as top via openings. To form the top via openings, mask and etch techniques can be employed. For example, a mask (not shown), such as a photoresist, can be used to form the top via opening in the first region. The mask is selectively exposed and developed to create the desired via opening patterns in the first region while covering the second and third regions. In one embodiment, the mask includes a pattern which protects or covers the dielectric layer except where top via openings are to be formed. Exposed portions of the dielectric layer which are not covered by the mask pattern are removed by, for example, a dry etch or RIE. For example, via opening 284a formed in the first region exposes portion of the top electrode 166a.

The process continues to form a conductive layer. The conductive layer covers the dielectric layer and fills the via opening 284a. The conductive layer, for example, is a Cu layer. Other suitable types of conductive layers may also be useful. The conductive layer may be formed by, for example, electroless copper plating (ECP). Other suitable techniques for forming the conductive layer may also be useful. The conductive layer sufficiently fills the via opening 284a while excess conductive material is removed by CMP, forming top via contact 184a which is coupled to the top electrode 166a in the first region as shown in FIG. 2k. The top via contact 184a, as shown, is formed by a single damascene process.

Referring to FIG. 2l, a dielectric liner 179 and a sixth upper dielectric layer 278 are formed over the fifth upper dielectric layer 276 in the first, second and third regions and sufficiently covers the top surface of the top via contact 184a in the first region. The sixth upper dielectric layer, for example, is TEOS and the dielectric liner 179, for example, is nBLOK. The dielectric liner 179, for example, may serve as an etch stop layer during subsequent processing. These layers may be formed by CVD. Other suitable dielectric materials and techniques may be used for forming these layers. The third, fourth, fifth and sixth upper dielectric layers in combination, for example, may be referred to as a dielectric layer 180.

In one embodiment, the dielectric layer 180 is processed to form via openings 284c in the third region and via openings (not shown) in the second region as shown in FIG. 2m. To form the via openings, mask and etch techniques can be employed. For example, a mask (not shown), such as a photoresist, can be used to form the via openings in the second and third regions while covering the first region. Exposed portion which are not covered by the mask pattern are removed by, for example, a dry etch or RIE. The etch, for example, stops on top of the dielectric liner 140. For example, via opening formed in the second and third region exposes portion of the dielectric liner 140. In one embodiment, the via openings in the second and third regions are formed simultaneously. Alternatively, the via openings in the second and third regions are formed in separate steps.

Referring to FIG. 2m, the sixth upper dielectric layer 278 is patterned to form third type trenches 285a in the first and third regions and fourth type trenches 285b in the second region simultaneously. The trenches may be formed by mask and etch techniques. For example, a mask (not shown), such as photoresist, may be used to serve as an etch mask to pattern the upper dielectric layer 278 to form the trenches. The etch, for example, is a two-step etch process which can be performed in-situ. The first etch, for example, is highly selective to the materials of the dielectric layer and stops on top of the dielectric liner 179 while the second etch, for example, is highly selective to material of the dielectric liner and removes exposed portions of the dielectric liners 179 and 140. Thus, dual damascene openings are formed in the second and third regions and single damascene opening is formed in the first region. For example, the third type trench 285a in the first region is in communication with the via contact 184a which is in communication with the top electrode 166a while the third type trench 285a in the third region is in communication with the via opening 284c which is in communication with metal line 135c as shown in FIG. 2n. Fourth type trenches 285b are in communication with via openings (not shown) which are in communication with metal lines 135b in the second region. In one embodiment, the trenches 285a and 285b correspond to top metal line trenches having 2 times the depth of the trenches 235a and 235b. The fourth type trenches 285b, for example, are formed in a second slanted arrangement in a second angle (θ') when viewed from top. The second angle θ', for example, may be +30° from the normal or straight line direction when viewed from top. It is to be understood that the fourth type trenches 285b may be formed in other suitable angle from the normal direction when viewed from top.

Referring to FIG. 2o, a conductive layer is formed. The conductive layer covers the dielectric layer 180 as well as filling the trenches and via openings. For example, the conductive layer fills the trench in the first region while filling both the trenches and via openings in the second and third regions. The conductive layer should be sufficiently thick to fill the trenches and via openings. In one embodiment, the conductive layer is a Cu layer. Other suitable types of conductive layers may also be useful. The conductive layer may be formed by, for example, ECP. Other suitable techniques for forming the conductive layer may also be useful.

The conductive layer sufficiently fills the trenches and via openings while excess conductive material is removed by CMP, forming metal line 185a in the first region, metal lines 185b and via contacts 184b₁-184b₂ (not shown) in the second region and metal line 185c and via contact 184c in the third region as shown in FIG. 2o. The metal lines 185b correspond to upper inductor level of the inductor 170. The via contacts 184b₁-184b₂ (not shown) connect the metal lines 185b to the metal lines 135b in the second region. As shown, the top surface of the metal lines is substantially planar with the top surface of the dielectric layer 180. The metal line in the first region is formed by a single damascene process while the metal lines and via contacts in the second region and third regions are formed by dual damascene process.

The process continues to complete formation of the IC. The process, for example, may continue to form passivation layer and pad interconnects or bonding pads. Further processing can include final passivation, dicing, assembly and packaging. Other processes are also useful.

FIGS. 3a-3i show simplified cross-sectional views of another embodiment of a process 300 for forming a device. The process 300 include similar processes as described in FIGS. 2a-2o and the device formed, for example, is the same as that shown in FIG. 1d. In the interest of brevity, common elements and features having the same reference numerals may not be described or described in detail.

As shown in FIG. 3a, the process is at the same stage as that described in FIG. 2d. For example, the top electrode layer and one or more layers of the MTJ stack are patterned to define the MTJ stack 164a and top electrode 166a of the memory cell. The top electrode layer and the layers of the MTJ stack are removed from the third region while portions of the top electrode 166b and the MTJ stack 164b remain in the second region. The process continues by depositing a dielectric liner 390 over the first, second and third regions. The dielectric liner 390 covers exposed surfaces of the top and bottom electrode layers and MTJ stack in the first and second regions and covers top surface of the bottom electrode layer in the third region. The dielectric liner 390, for example, may be formed by CVD and serves as an etch stop layer or protective layer during subsequent processing. The dielectric liner may be a low k dielectric liner. For example, the dielectric liner may be nBLOK. Other suitable types of dielectric materials for the dielectric liner and forming techniques may also be useful.

Referring to FIG. 3b, a third upper dielectric layer 272 is formed. The third upper dielectric layer is formed over the dielectric liner 390 and sufficiently covers the patterned MTJ stack and top electrode layer in the first and second regions. The process continues to pattern the third upper dielectric layer 272, dielectric liner 390 and the bottom electrode layer 262. Techniques for forming and patterning of these layers are the same as that described in FIGS. 2e and 2f. The patterning process defines the bottom electrode 162a of the memory cell in the first region while removing portions of the bottom electrode layer not protected by the mask in the second region. The dielectric liner 390, bottom electrode layer 262 and the third upper dielectric layer 272 in the third region are completely removed. The etch stops when it reaches top surface of the second upper dielectric layer 150. The MTJ stack and the top and bottom electrode layers are patterned in such a way that the bottom electrode and the MTJ stack are aligned and properly coupled to the via plug 144 in the first region 110a. The patterned third dielectric layer 272 and dielectric liner 190a, as shown, covers the top electrode, MTJ stack and top surface of the bottom electrode in the first region while the patterned third dielectric layer and dielectric liner 190b cover the top surface of the top electrode in the second region as shown in FIG. 3b.

Figure 3C:
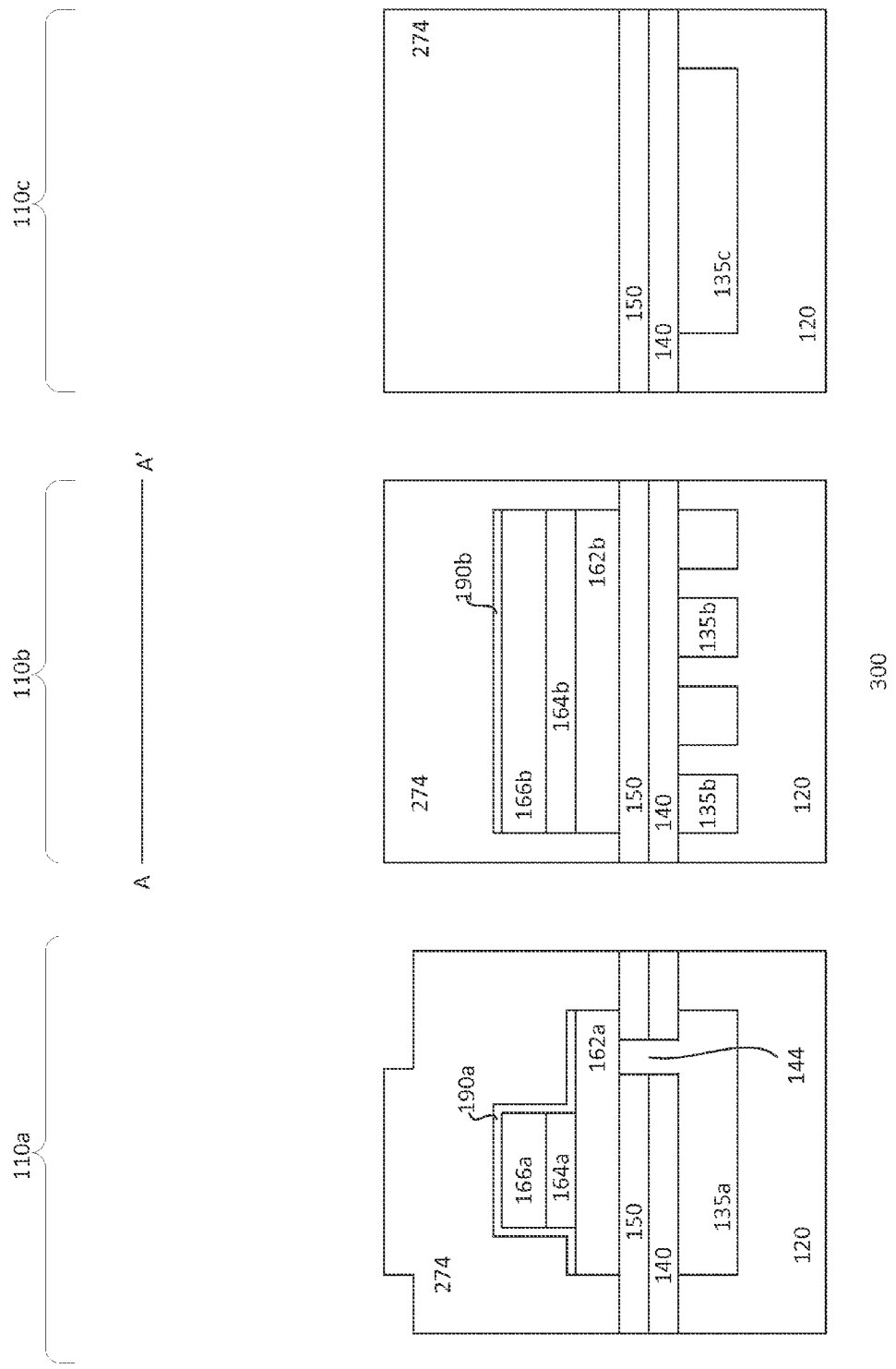
Figure 3D:
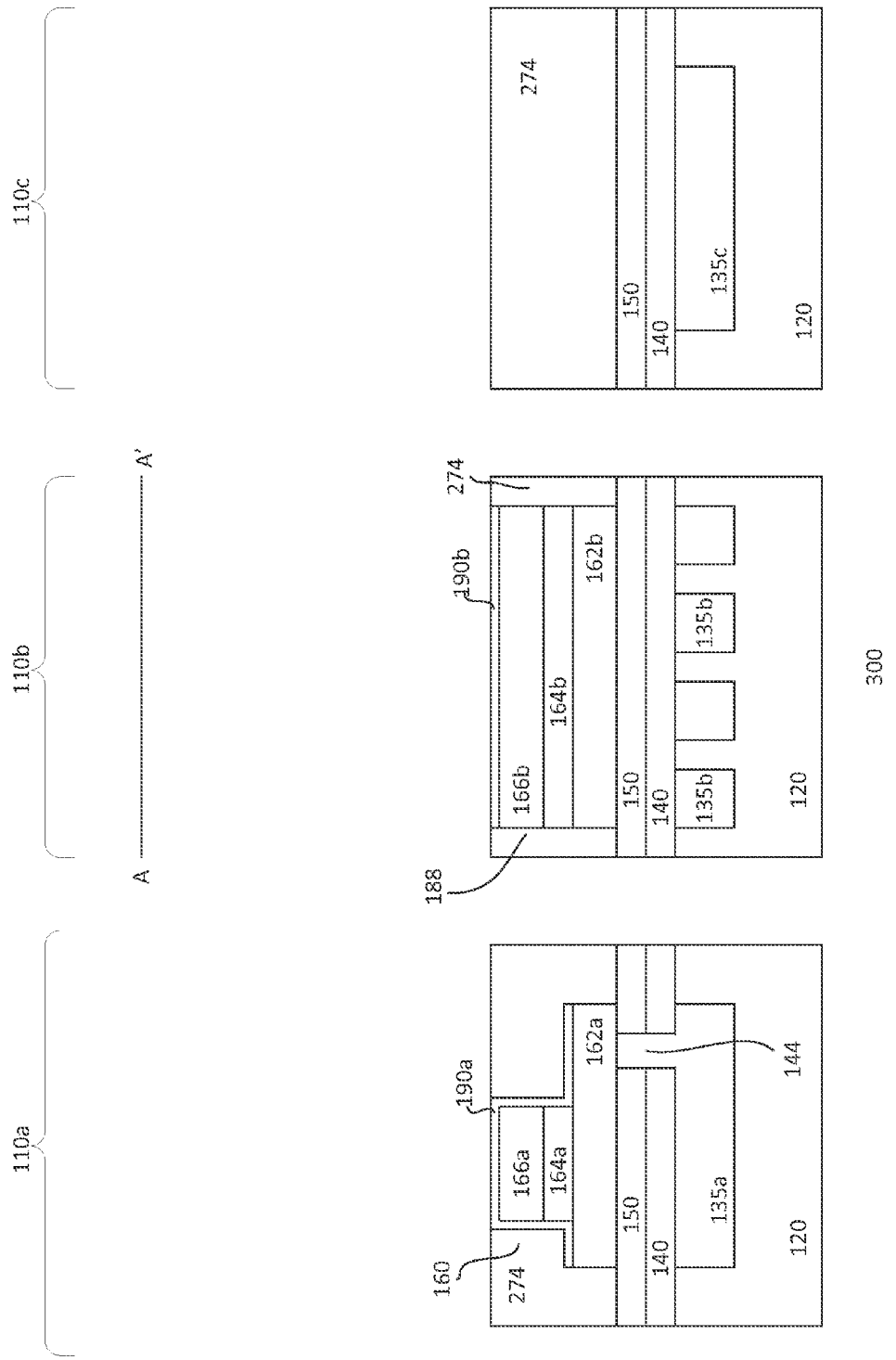

A fourth upper dielectric layer 274 is formed on the substrate, as shown in FIG. 3c. The fourth upper dielectric layer is formed over the second upper dielectric layer 150 and sufficiently covers the patterned MTJ stack and top and bottom electrodes in the first and second regions. A planarization process is performed to remove excess fourth upper dielectric layer. Material and techniques for forming and planarizing the fourth upper dielectric layer are the same as that described in FIGS. 2g and 2h. In one embodiment, the planarization process produces a substantially planar top surface between the top surface of the dielectric liners 190a and 190b and the fourth upper dielectric layer 274 as shown in FIG. 3d. As shown, the planarized fourth upper dielectric layer 274 surrounds and covers the sides of the memory element 160 and magnetic core 188 in the first and second regions.

The process continues to form a fifth upper dielectric layer 276. The fifth upper dielectric layer is formed over the fourth upper dielectric layer 274 and sufficiently covers the top surface of the dielectric liners 190a and 190b in the first and second regions. In one embodiment, the process continues to form a dielectric liner 179 over the fifth upper dielectric layer 276 in the first, second and third regions. Materials and techniques for forming the fifth upper dielectric layer 276 and the dielectric liner 179 are the same as that described in FIGS. 2i and 2l.

In one embodiment, the dielectric liner 179 is processed to form openings 381 in the first, second and third regions as shown in FIG. 3e. The openings 381 in the second region are not shown in FIG. 3e. In one embodiment, the openings 381 expose portions of the underlying fifth upper dielectric layer 276 which will be removed to form via openings later. To form the openings 381, mask and etch techniques can be employed. For example, a mask (not shown), such as a photoresist, can be used to form the openings in the dielectric liner 179. Exposed portions of the dielectric liner 179 in the first, second and third regions which are not covered by the mask pattern are removed by, for example, a dry etch or RIE. Other suitable techniques may also be employed to form the openings 381 in the dielectric liner 179.

Figure 3F:
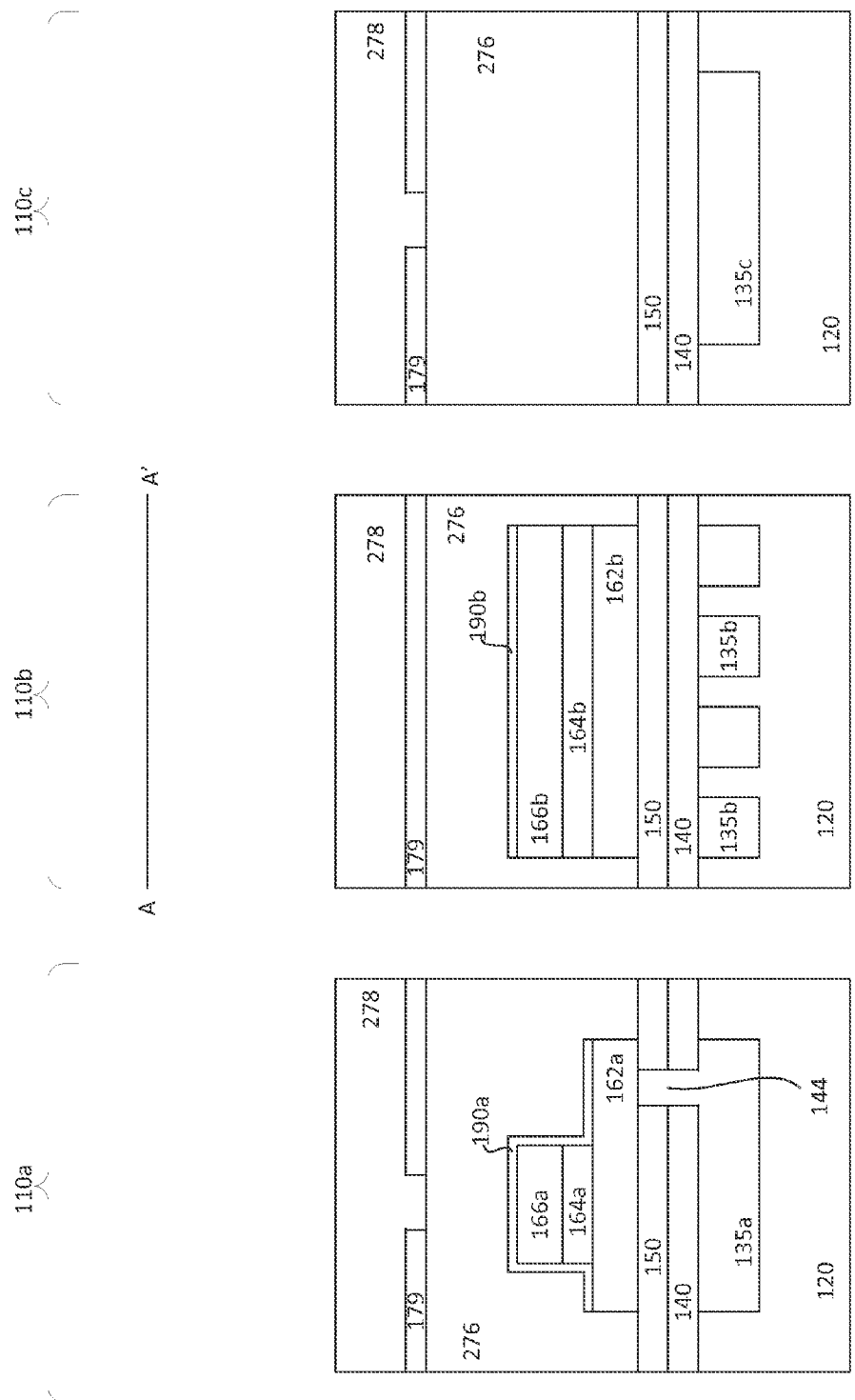

Referring to FIG. 3f, a sixth upper dielectric layer 278 is formed over the dielectric liner 179. Material and technique for forming the sixth upper dielectric layer are the same as that described in 2l. In one embodiment, the sixth upper dielectric layer also fills the openings 381 in the first, second and third regions. The third, fourth, fifth and sixth upper dielectric layers in combination, for example, may be referred to as a dielectric layer 180.

The process continues to form dual damascene openings having trenches and via openings in the dielectric layer 180 in the first, second and third regions. Referring to FIG. 3g, the sixth upper dielectric layer 278 is patterned to form third type trenches 285a in the first and third regions and fourth type trenches 285b in the second region simultaneously. The trenches may be formed by mask and etch techniques and the trenches have the same configuration as that described in FIG. 2m. For example, a mask (not shown), such as photoresist, may be used to serve as an etch mask to pattern the upper dielectric layer 278 to form the trenches in the first, second and third regions. A first etch, for example, which is highly selective to the materials of the dielectric layer is employed to remove exposed portions of the dielectric layer to form the trenches. In one embodiment, since the openings 381 in the dielectric liner 179 are filled with sixth upper dielectric layer, the first etch simultaneously removes the exposed portion of the sixth upper dielectric layer to forms trenches and removes the underlying dielectric material of the fifth upper dielectric layer to form via openings which pass through the openings 381 in the dielectric liner. As shown, the first etch forms the via opening 284a in the first region and stops when it reaches the dielectric liner 190a while the first etch continues to remove dielectric materials to form via openings (not shown) in the second region and via opening 284c in the third region. In this case, the dielectric liner 190a protects the top electrode 166a from being consumed while the first etch continues to form via openings in the second and third regions. Thus, the trenches and via openings, for example, are formed by the same first etch process. Since the first etch is highly selective to the materials of the dielectric layer, the first etch, for example, stops when it reaches top surface of the dielectric liners 179, 190a and 140. In other embodiments, the etch may partially consume the dielectric liner 179, 190a and 140.

Figure 3H:
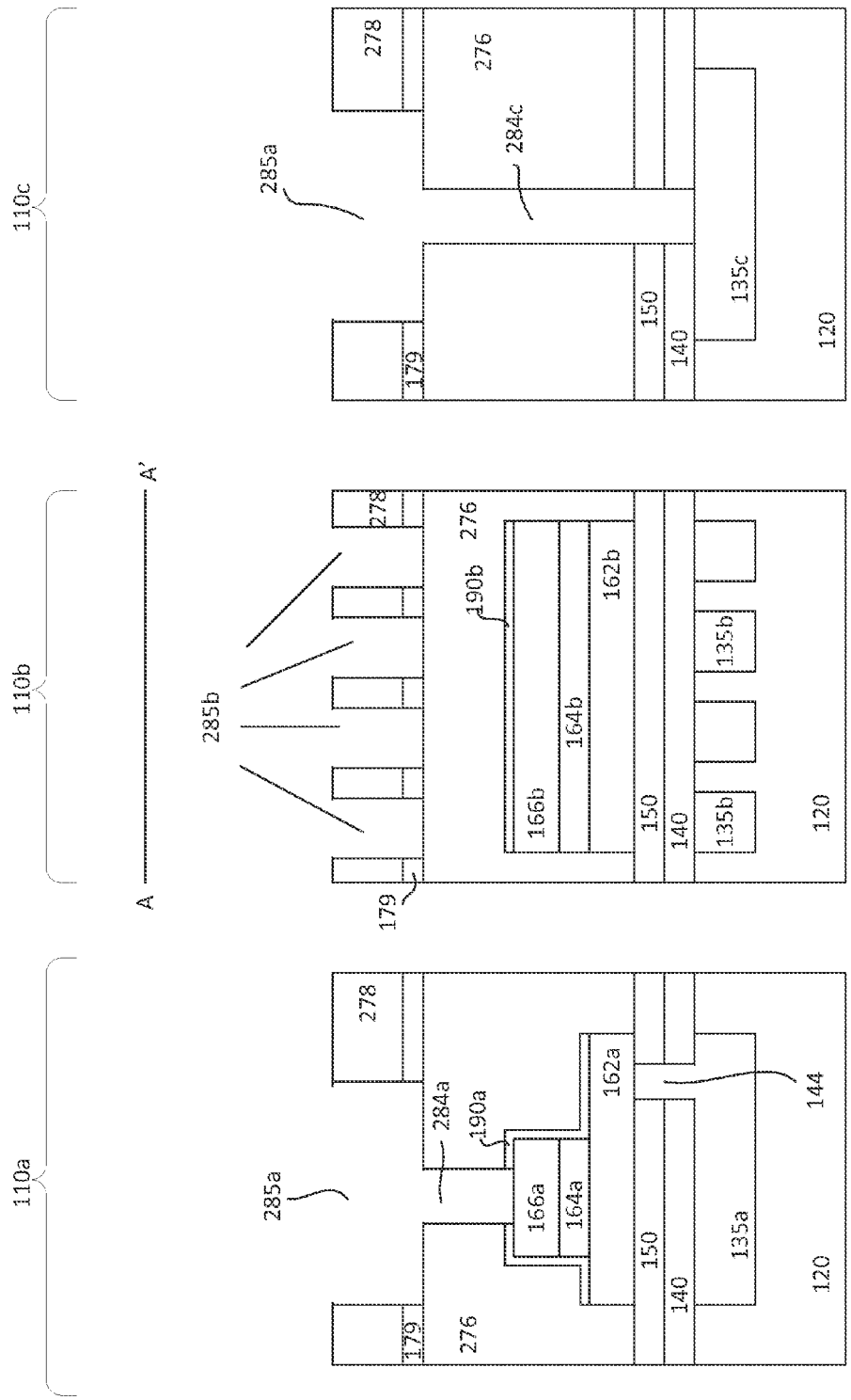

The process continues to remove exposed portions of the dielectric liners 179, 190a and 140 in the first, second and third regions as shown in FIG. 3h. For example, a second etch which is highly selective to the materials of the dielectric liners are employed to remove exposed portions of the dielectric liners. This, for example, exposes top surface of the top electrode 166a in the first region and top surfaces of the metal lines 135b and 135c in the second and third regions. Thus, dual damascene openings are formed in the first, second and third regions. As shown, the third type trench 285a in the first region is in communication with the via opening 284a which is in communication with the top electrode 166a while the third type trench 285a in the third region is in communication with the via opening 284c which is in communication with metal line 135c as shown in FIG. 3h. Fourth type trenches 285b are in communication with via openings (not shown) which are in communication with metal lines 135b in the second region.

Figure 3I:
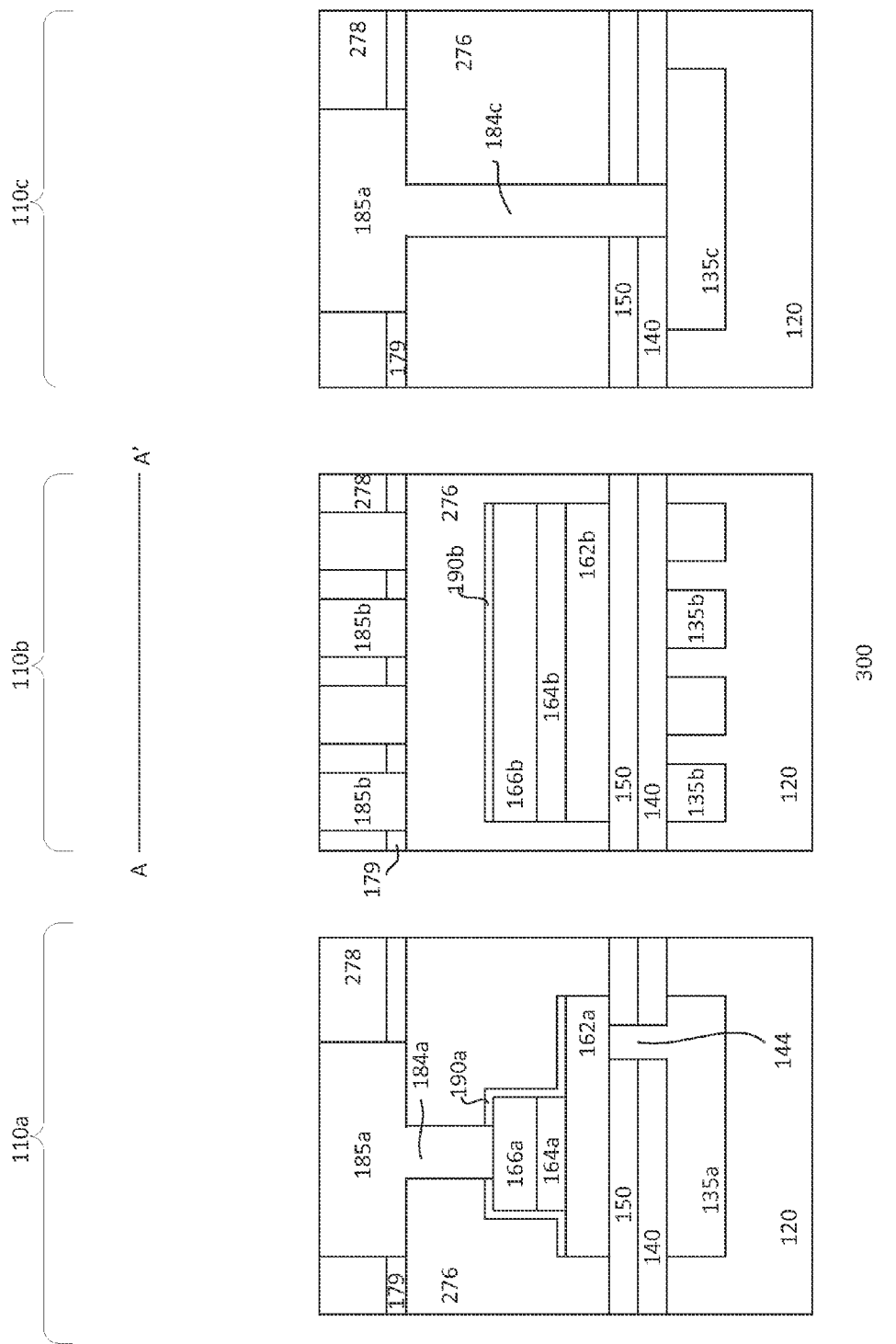

Referring to FIG. 3i, a conductive layer is formed. The conductive layer covers the dielectric layer 180 as well as filling the trenches and via openings. For example, the conductive layer fills both the trenches and via openings in the first, second and third regions. The conductive layer should be sufficiently thick to fill the trenches and via openings. Excess conductive material is removed by CMP, forming metal line 185a and top via contact 184a in the first region, metal lines 185b and via contacts $184b_1$-$184b_2$ (not shown) in the second region and metal line 185c and via contact 184c in the third region as shown in FIG. 3i. The metal lines 185b correspond to upper inductor level of the inductor 170. The via contacts $184b_1$-$184b_2$ (not shown) connect the metal lines 185b to the metal lines 135b in the second region. As shown, the top surface of the metal lines is substantially planar with the top surface of the dielectric layer 180. The metal lines and top via contacts in the first, second and third regions are formed by dual damascene process.

The process continues to complete formation of the IC. The process, for example, may continue to form passivation layer and pad interconnects or bonding pads. Further processing can include final passivation, dicing, assembly and packaging. Other processes are also useful.

The processes 200 and 300 as described in FIGS. 2a-2o and FIG. 3a-3i integrate the formation of MRAM cell and inductor together on the same substrate using logic processing, resulting in a device such as that shown in FIG. 1a or FIG. 1d. As described and as shown in FIG. 1b, a metal line 135b includes first and second opposing ends while a metal line 185b includes first and second opposing ends. In one embodiment, the first end of a metal line 185b is coupled to the underlying first end of the metal line 135b through a via contact $184b_1$ while the second end of the same metal line 185b is coupled to a second end of adjacent lower metal line 135b through a separate via contact $184b2$. Thus, the metal lines 185b in the upper inductor level and the metal lines 135b in the lower inductor level coupled by the via contacts $184b_1$ and $184b_2$ form loops or coils of an inductor with a magnetic core structure 178 disposed in between the loops. This forms a 3-D magnetic inductor structure 170 together with a MRAM cell 160 on the same substrate.

As described, the device includes one inductor and one memory cell. However, it is understood that a device may include numerous memory cells and inductors integrated into the same IC.

The embodiment as described in FIGS. 1a-1d, FIGS. 2a-2o and FIGS. 3a-3i result in advantages. For example, memory cell and inductor are formed concurrently on the same substrate using logic processing without compromising the reliabilities of the memory cell, the inductor and other components in the logic region on the same substrate. The integration of the inductor with the memory cell enables the device to be used for, for example, RF applications. Moreover, the process as described is highly compatible with logic processing or technology. This avoids the investment of new tools and does not require additional or new masks, providing a cost effective solution. Also, a magnetic core is simultaneously formed with the layers of the memory element of the MRAM cell. This provides a magnetic core type inductor to be formed. The presence of the magnetic core increases the inductance, allowing a high performance inductor to be integrated with the memory cell in the same IC. Furthermore, the process shown in FIGS. 3a-3i describes formation of the top metal trenches which would also result in simultaneous formation of underlying top via openings, allowing formation of dual damascene openings having trenches and via openings to be formed in a single step in all three regions. This simplifies the manufacturing process and provides a cost saving solution.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate defined with at least first and second regions;
   providing a first upper dielectric layer over the substrate, wherein the first upper dielectric layer comprises a first upper interconnect level with a plurality of metal lines in the first and second regions;
   providing a dielectric layer over the first upper dielectric layer, wherein the dielectric layer comprises a second upper interconnect level with a plurality of metal lines in the first and second regions;
   forming a magnetic random access memory (MRAM) cell, wherein the MRAM cell is disposed between the first and second upper interconnect levels in the first region; and
   forming an inductor in the second region, wherein the inductor comprises a lower inductor level formed from the metal lines in the first upper interconnect level and an upper inductor level formed from the metal lines in the second upper interconnect level, wherein the metal lines in the lower inductor level and upper inductor level are coupled by via contacts to form loops of the inductor.

2. The method of claim 1 wherein the metal lines of the first upper interconnect level are formed by:
   forming first type trenches in the first region and forming second type trenches in the second region, wherein the first and second type trenches are formed simultaneously; and
   filling the first and second type trenches with a conductive material to form the metal lines of the first upper interconnect level.

3. The method of claim 2 wherein the first type trenches and the second type trenches are defined based on 1X design rule.

4. The method of claim 2 wherein the second type trenches are formed in a first slanted arrangement in a first angle when viewed from top.

5. The method of claim 1 comprising:
   forming a first dielectric liner over the first upper dielectric layer covering the metal lines in the first and second regions; and
   forming a second upper dielectric layer on top of the first dielectric liner.

6. The method of claim 5 wherein forming the MRAM cell comprises:
   forming a bottom electrode layer over the second upper dielectric layer in the first and second regions;
   forming various layers of a magnetic tunnel junction (MTJ) stack over the bottom electrode layer in the first and second regions; and
   forming an upper electrode layer over the MTJ stack layers in the first and second regions.

7. The method of claim 6 wherein forming the MRAM cell comprises:
   patterning the upper electrode layer and one or more layers of the MTJ stack which are formed in the first and second regions; and
   forming a third upper dielectric layer over the bottom electrode layer and covers the patterned upper electrode layer and MTJ stack layers.

8. The method of claim 7 wherein forming the MRAM cell comprises:
   patterning the third upper dielectric layer and the bottom electrode layer in the first and second regions; and wherein
   the patterned bottom electrode layer in the first region comprises a length which is greater than length of the patterned MTJ stack and upper electrode layer in the first region when viewed in a first direction; and
   the patterned bottom electrode layer, MTJ stack and upper electrode layer in the second region comprise the same width when viewed in a second direction.

9. The method of claim 8 wherein the patterned bottom electrode layer, MTJ stack and upper electrode layer in the second region provides a magnetic core for the inductor.

10. The method of claim 9 comprising:
    forming a fourth upper dielectric layer covering the patterned upper and bottom electrode layers and MTJ stack in the first and second regions;
    performing a planarization process to produce a substantially planar top surface between top surface of the patterned upper electrode and fourth upper dielectric layer;
    forming a fifth upper dielectric layer over the top surfaces of the planarized fourth upper dielectric layer and upper electrode;
    forming a via opening in the first region, wherein the via opening exposes a portion of the upper electrode; and
    filling the via opening in the first region with a conductive material to form a top via contact in the first region.

11. The method of claim 10 comprising:
    forming a second dielectric liner over the fifth upper dielectric layer in the first and second regions; and
    forming a sixth upper dielectric layer over the second dielectric liner, wherein the third, fourth, fifth and sixth upper dielectric layers in combination correspond to the dielectric layer which comprises the second upper interconnect level.

12. The method of claim 11 comprising:
    forming via openings in the second region through the dielectric layer, wherein the via openings in the second region are in communication with the metal lines in the first interconnect level in the second region;
    forming third type trenches in the first region and forming fourth type trenches in the second region in the dielectric layer, wherein the third and fourth type trenches are formed simultaneously, wherein the third type trenches and the fourth type trenches are defined based on 2X design rule, and the fourth type trenches are formed in a second slanted arrangement in a second angle when viewed from top.

13. The method of claim 12 comprising filling the third and fourth type trenches in the first and second regions and the via openings in the dielectric layer in the second region with a conductive material, wherein the third and fourth type trenches filled with conductive material form the metal lines of the second upper interconnect level and the via openings in the second region filled with conductive material form the via contacts of the inductor.

14. The method of claim 7 wherein forming the MRAM cell comprises:
    forming a protective layer over the patterned upper electrode and various layers of the MTJ stack;
    patterning the third upper dielectric layer, the protective layer and the bottom electrode layer in the first and second regions; and wherein
    the patterned bottom electrode layer in the first region comprises a length which is greater than length of the patterned MTJ stack and upper electrode layer in the first region when viewed in a first direction; and the patterned bottom electrode layer, MTJ stack and upper electrode layer in the second region comprise the same width when viewed in a second direction.

15. The method of claim 14 comprising:

forming a fourth upper dielectric layer covering the protective layer and the patterned upper and bottom electrode layers and MTJ stack in the first and second regions;

performing a planarization process to produce a substantially planar top surface between top surface of the protective layer and fourth upper dielectric layer;

forming a fifth upper dielectric layer over the top surfaces of the planarized fourth upper dielectric layer in the first and second regions and forming a second dielectric liner over the fifth upper dielectric layer;

forming openings in the second dielectric liner in the first and second regions, wherein the via opening exposes a portion of the fifth upper dielectric layer; and forming a sixth upper dielectric layer over the second dielectric liner, wherein the sixth upper dielectric layer fills the openings in the second dielectric liner, and wherein the third, fourth, fifth and sixth upper dielectric layers in combination correspond to the dielectric layer which comprises the second upper interconnect level.

16. The method of claim 15 comprising:

forming third type trenches in the first region and forming fourth type trenches in the second region in the dielectric layer, wherein the third type trenches and the fourth type trenches are defined based on 2X design rule, and the fourth type trenches are formed in a second slanted arrangement in a second angle when viewed from top; and forming via openings which pass through the openings in the second dielectric liner and the dielectric layer in the first and second regions, wherein the trenches and via openings are formed simultaneously and the via opening in the first region is in communication with the upper electrode and the via openings in the second region are in communication with the metal lines in the first upper interconnect level in the second region.

17. A device comprising:

a substrate defined with at least first and second regions;

a first upper dielectric layer disposed over the substrate, wherein the first upper dielectric layer comprises a first upper interconnect level with a plurality of metal lines in the first and second regions;

a dielectric layer disposed over the first upper dielectric layer, wherein the dielectric layer comprises a second upper interconnect level with a plurality of metal lines in the first and second regions;

a magnetic random access memory (MRAM) cell, wherein the MRAM cell is disposed between the first and second upper interconnect levels in the first region; and an inductor disposed in the second region, wherein the inductor comprises a lower inductor level formed from the metal lines in the first upper interconnect level and an upper inductor level formed from the metal lines in the second upper interconnect level, wherein the metal lines in the lower inductor level and upper inductor level are coupled by via contacts to form coils of the inductor.

18. The device of claim 17 wherein the metal lines in the first upper interconnect level are defined based on 1X design rule and the metal lines in the second upper interconnect level are defined based on 2X design rule.

19. The device of claim 17 wherein the metal lines of the first upper interconnect level in the second region are formed in a first slanted arrangement in a first angle and the metal lines of the second upper interconnect level in the second region are formed in a second slanted arrangement in a second angle when viewed from top.

20. The device of claim 19 wherein:

a metal line of the plurality of metal lines of the second upper interconnect level in the second region includes first and second opposing ends; and a metal line of the plurality of metal lines of the first upper interconnect level in the second region includes first and second opposing ends, wherein the first end of the metal line in the second upper interconnect level is coupled to the underlying first end of the metal line in the first upper interconnect level through a first via contact while the second end of the same metal line in the second upper interconnect level is coupled to a second end of adjacent metal line in the first upper interconnect level through a second via contact to form a loop of the inductor.

21. The device of claim 17 comprising:

bottom electrode, top electrode and MTJ stack layers disposed in between the first and second upper interconnect levels in the first and second regions, wherein the bottom electrode, top electrode and MTJ stack layers form the MRAM cell in the first region while the bottom electrode, top electrode and MTJ stack layers form a magnetic core for the inductor in the second region.

\* \* \* \* \*